US010102895B1

(12) United States Patent
Li et al.

(10) Patent No.: US 10,102,895 B1
(45) Date of Patent: Oct. 16, 2018

(54) BACK GATE BIASING MAGNETO-RESISTIVE RANDOM ACCESS MEMORY (MRAM) BIT CELLS TO REDUCE OR AVOID WRITE OPERATION FAILURES CAUSED BY SOURCE DEGENERATION

(71) Applicant: QUALCOMM Incorporated, San Diego, CA (US)

(72) Inventors: Xia Li, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/686,424

(22) Filed: Aug. 25, 2017

(51) Int. Cl.
| | |
|---|---|
| *G11C 11/00* | (2006.01) |
| *G11C 11/16* | (2006.01) |
| *G11B 5/39* | (2006.01) |
| *G11C 11/15* | (2006.01) |
| *H01L 43/08* | (2006.01) |
| *H01L 27/105* | (2006.01) |
| *G11C 11/412* | (2006.01) |

(52) U.S. Cl.
CPC .......... *G11C 11/1673* (2013.01); *G11B 5/39* (2013.01); *G11C 11/15* (2013.01); *G11C 11/1675* (2013.01); *G11C 11/412* (2013.01); *H01L 27/105* (2013.01); *H01L 43/08* (2013.01)

(58) Field of Classification Search
CPC ... G11C 11/16; G11C 11/161; G11C 11/1659; G11C 11/1675; G11C 11/15; G11C 11/14; G11C 11/1673; G11C 2207/063; G11C 7/062; G11C 11/1697; G11C 13/004; G11C 2013/0054; G11C 11/1693; G11C 11/5607; G11C 19/0808
USPC ........... 365/158, 148, 173, 207, 209, 210.11, 365/171, 189.07, 189.09, 210.1, 226, 157, 365/182, 189.06, 189.11
See application file for complete search history.

(56) References Cited

U.S. PATENT DOCUMENTS

| | | | |
|---|---|---|---|
| 2004/0027907 A1 | 2/2004 | Ooishi | |
| 2006/0067112 A1* | 3/2006 | Ferrant | G11C 8/14 365/158 |
| 2007/0242497 A1 | 10/2007 | Joshi et al. | |
| 2010/0172173 A1 | 7/2010 | Abu-Rahma et al. | |
| 2016/0225819 A1 | 8/2016 | Toh et al. | |
| 2017/0092347 A1 | 3/2017 | Gogl et al. | |

* cited by examiner

*Primary Examiner* — Thong Q Le
(74) *Attorney, Agent, or Firm* — Withrow & Terranova

(57) ABSTRACT

Back gate biasing magneto-resistive random access memory (MRAM) bit cells to reduce or avoid write operation failures caused by source degeneration are disclosed. In one aspect, an MRAM bit cell includes a magnetic tunnel junction (MTJ) device and an access transistor used to control reading and writing of the MRAM bit cell. To reduce or avoid source degeneration caused by a voltage at a source region of the access transistor in response to a write operation, a back gate bias voltage is applied to a back gate electrode of the access transistor, the back gate bias voltage controlled to be greater than or equal to a back gate voltage associated with the access transistor having a nominal threshold voltage corresponding to operation without source degeneration plus a voltage corresponding to the source region of the access transistor.

27 Claims, 14 Drawing Sheets

BACK GATE BIASING MAGNETO-RESISTIVE RANDOM ACCESS MEMORY (MRAM) BIT CELLS TO REDUCE OR AVOID WRITE OPERATION FAILURES CAUSED BY SOURCE DEGENERATION

BACKGROUND

I. Field of the Disclosure

The technology of the disclosure relates generally to magneto-resistive random access memory (MRAM), and particularly to back gate biasing MRAM bit cells.

II. Background

Semiconductor storage devices are used in integrated circuits (ICs) in electronic devices to provide data storage. One example of a semiconductor storage device is magneto-resistive random access memory (MRAM). MRAM is non-volatile memory in which data is stored by programming a magnetic tunnel junction (MTJ) device as part of an MRAM bit cell. One advantage of MRAM is that MTJ devices in MRAM bit cells can retain stored information even when power is turned off. This is because data is stored in the MTJ device as a small magnetic element rather than as an electric charge or current.

In this regard, an MTJ device comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ device according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ device by sensing a resistance when current flows through the MTJ device. Data can also be written and stored in the MTJ device by applying a magnetic field to change the orientation of the free layer to either a P or AP magnetic orientation with respect to the pinned layer.

Recent developments in MTJ devices involve spin-transfer torque (STT)-MTJ devices. In STT-MTJ devices, the spin polarization of carrier electrons, rather than a pulse of a magnetic field, is used to program the state stored in the STT-MTJ device (i.e., a '0' or a '1'). FIG. 1 illustrates an STT-MTJ device 100 that is provided as part of an MRAM bit cell 102 to store non-volatile data. A metal-oxide semiconductor (MOS) (typically N-type MOS, i.e., NMOS) access transistor 104 is provided to control reading and writing to the STT-MTJ device 100. A drain (D) of the access transistor 104 is coupled to a bottom electrode 106 of the STT-MTJ device 100, which is coupled to a pinned layer 108 for example. A word line (WL) is coupled to a gate (G) of the access transistor 104. A source (S) of the access transistor 104 is coupled to a voltage source ($V_S$) through a source line (SL). The voltage source ($V_S$) provides a voltage ($V_{SL}$) on the source line (SL). A bit line (BL) is coupled to a top electrode 110 of the STT-MTJ device 100, which is coupled to a free layer 112 for example. The pinned layer 108 and the free layer 112 are separated by a tunnel barrier 114.

With continuing reference to FIG. 1, when writing data to the MRAM bit cell 102, the gate (G) of the access transistor 104 is activated by activating the word line (WL). A voltage differential between a voltage ($V_{BL}$) on the bit line (BL) and the voltage ($V_{SL}$) on the source line (SL) is applied. As a result, a write current $I_W$ is generated between the drain (D) and the source (S) of the access transistor 104. If the magnetic orientation of the STT-MTJ device 100 in FIG. 1 is to be changed from AP to P, a write current ($I_{AP-P}$) flowing from the free layer 112 to the pinned layer 108 is generated. This induces an STT at the free layer 112 to change the magnetic orientation of the free layer 112 to P with respect to the pinned layer 108. If the magnetic orientation is to be changed from P to AP, a current ($I_{P-AP}$) flowing from the pinned layer 108 to the free layer 112 is produced, which induces an STT at the free layer 112 to change the magnetic orientation of the free layer 112 to AP with respect to the pinned layer 108.

To write to the MRAM bit cell 102, the write current ($I_W$) must be greater than or equal to a critical switching current ($I_C$) for the STT-MTJ device 100, which is the current required to switch the magnetic orientation of the free layer 112. However, various conditions may cause the write current ($I_W$) to fall below the critical switching current ($I_C$), resulting in write operation failures. One way to increase the write current $I_W$ is to increase the size of the access transistor 104 to increase drive strength by reducing the corresponding resistance (R) of the access transistor 104. However, increasing the size of the access transistor 104 increases area of the MRAM bit cell 102. Thus, it would be advantageous to increase the write current $I_W$ without increasing the area of the MRAM bit cell 102 to reduce or avoid write operation failures that can be caused by the write current $I_W$ falling below the critical switching current ($I_C$).

SUMMARY OF THE DISCLOSURE

Aspects disclosed herein include back gate biasing magneto-resistive random access memory (MRAM) bit cells to reduce or avoid write operation failures caused by source degeneration. As used herein, source degeneration refers to a decrease in a write current applied to an MRAM bit cell as a result of an increased threshold voltage of an access transistor of the MRAM bit cell due to a voltage present at a source region of the access transistor for a write operation. In one exemplary aspect, an MRAM bit cell includes a magnetic tunnel junction (MTJ) device and an access transistor used to control read and write operations to the MRAM bit cell. The access transistor includes a gate region formed over a channel region between a first region and a second region of the access transistor, wherein each of the first and second regions may be a drain region or a source region. In particular, designation of the source region and the drain region of the access transistor is dependent on the voltage applied to a corresponding bit line and source line, wherein the region corresponding to a higher voltage is considered the drain region while the region corresponding to a lower voltage is considered the source region. An activation voltage applied to a word line electrically coupled to the gate region controls activation of the access transistor for write operations to generate a write current from a source line electrically coupled to the second region to the MTJ device electrically coupled to the first region. To reduce or avoid source degeneration caused by a voltage at the source region (e.g., the first region) of the access transistor in response to a write operation, a back gate bias voltage is applied to a back gate electrode of the access transistor. In particular, to overcome the effects of source degeneration, the back gate bias voltage is controlled to be greater than or equal to a back gate voltage associated with the access transistor having a nominal threshold voltage corresponding to operation without source degeneration plus a voltage corresponding to the source region of the access transistor. As used herein, a nominal threshold voltage of a transistor is defined as the threshold voltage achieved under on ideal operating conditions. In other words, the voltage applied to bias a back gate region of the access transistor is increased by at least the voltage at the source region. Increasing the voltage applied to the back gate region in this manner reduces a threshold voltage of the access transistor resulting in lower threshold voltage, thus resulting in an increase in write current applied to the MTJ device by the access transistor. Thus, applying the back gate bias voltage as described above can increases write current so as to reduce or avoid write operation failures in the MRAM bit cell without having to increase the area consumption of the MRAM bit cell.

In this regard in one aspect, an MRAM bit cell is provided that comprises an MTJ device and an access transistor. The MTJ device comprises a first ferromagnetic layer, a second ferromagnetic layer electrically coupled to a bit line, and a tunnel barrier disposed between the first ferromagnetic layer and the second ferromagnetic layer. The access transistor comprises a substrate layer, a well region formed over the substrate layer, a buried oxide (BOX) region formed over the well region, and a channel region formed over the BOX region. The access transistor also comprises a first region formed over the BOX region on a first side of the channel region. The first region is electrically coupled to the first ferromagnetic layer of the MTJ device. The access transistor further comprises a second region formed over the BOX region on a second side of the channel region. The second region is electrically coupled to a source line. The access transistor further comprises a gate region formed over the channel region between the first region and the second region. The gate region is electrically coupled to a word line. The access transistor also comprises a back gate electrode formed over the well region. The back gate electrode is electrically coupled to the well region and a back gate line configured to apply a back gate bias voltage controlled to be greater than or equal to a back gate voltage associated with the access transistor having a nominal threshold voltage corresponding to operation without source degeneration plus a voltage corresponding to a source region of the access transistor.

In another aspect, an MRAM bit cell is provided that comprises an MTJ device and an access transistor. The MTJ device comprises a first ferromagnetic layer, a second ferromagnetic layer electrically coupled to a bit line, and a tunnel barrier disposed between the first ferromagnetic layer and the second ferromagnetic layer. The access transistor comprises a first region electrically coupled to the first ferromagnetic layer of the MTJ device, a second region electrically coupled to a source line, and a gate region electrically coupled to a word line. The access transistor further comprises a back gate electrode electrically coupled to a back gate line configured to apply a back gate bias voltage controlled to be greater than or equal to a back gate voltage associated with the access transistor having a nominal threshold voltage corresponding to operation without source degeneration plus a voltage corresponding to a source region of the access transistor.

In another aspect, a method for writing to an MRAM bit cell is provided. The method comprises applying a source line voltage to a source line electrically coupled to a second region of an access transistor. A first region of the access transistor is electrically coupled to a first ferromagnetic layer of an MTJ device. The method also comprises applying a bit line voltage to a bit line electrically coupled to a second ferromagnetic layer of the MTJ device. The method further comprises applying a back gate bias voltage that is greater than or equal to a back gate voltage associated with the access transistor having a nominal threshold voltage corresponding to operation without source degeneration plus a voltage corresponding to a source region of the access transistor to a back gate line electrically coupled to a back gate electrode of the access transistor. The method also comprises applying a word line voltage to a word line electrically coupled to a gate region of the access transistor.

In another aspect, an MRAM system is provided that comprises a plurality of MRAM bit cells. Each MRAM bit cell of the plurality of MRAM bit cells comprises an MTJ device and an access transistor. The MTJ device comprises a first ferromagnetic layer, a second ferromagnetic layer electrically coupled to a corresponding bit line, and a tunnel barrier disposed between the first ferromagnetic layer and the second ferromagnetic layer. The access transistor comprises a substrate layer, a well region formed over the substrate layer, a BOX region formed over the well region, and a channel region formed over the BOX region. The access transistor also comprises a first region formed over the BOX region on a first side of the channel region. The first region is electrically coupled to the first ferromagnetic layer of the MTJ device. The access transistor further comprises a second region formed over the BOX region on a second side of the channel region. The second region is electrically coupled to a corresponding source line. The access transistor also comprises a gate region formed over the channel region between the first region and the second region. The gate region is electrically coupled to a corresponding word line. The access transistor further comprises a back gate electrode formed over the well region. The back gate electrode is electrically coupled to the well region and a back gate line configured to apply a back gate bias voltage controlled to be greater than or equal to a back gate voltage associated with the access transistor having a nominal threshold voltage corresponding to operation without source degeneration plus a voltage corresponding to a source region of the access transistor. The MRAM system also comprises one or more shallow trench isolation (STI) regions. Each STI region is formed between and electrically isolates at least two (2) MRAM bit cells of the plurality of MRAM bit cells.

DETAILED DESCRIPTION

Figure 1:
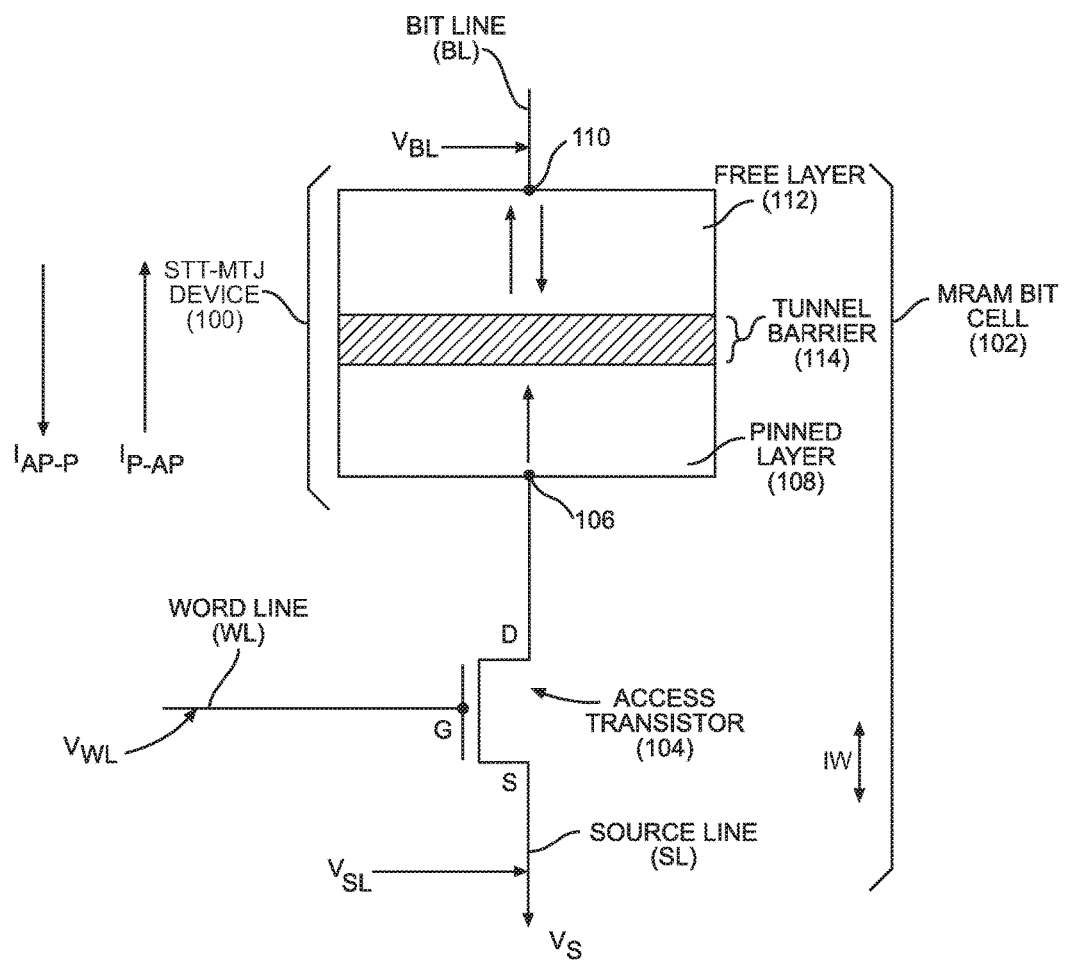
FIG. 1 is a diagram of an exemplary magneto-resistive random access memory (MRAM) bit cell in the prior art.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include back gate biasing magneto-resistive random access memory (MRAM) bit cells to reduce or avoid write operation failures caused by source degeneration. As used herein, source degeneration refers to a decrease in a write current applied to an MRAM bit cell as a result of an increased threshold voltage of an access transistor of the MRAM bit cell due to a voltage present at a source region of the access transistor for a write operation. In one exemplary aspect, an MRAM bit cell includes a magnetic tunnel junction (MTJ) device and an access transistor used to control read and write operations to the MRAM bit cell. The access transistor includes a gate region formed over a channel region between a first region and a second region of the access transistor, wherein each of the first and second regions may be a drain region or a source region. In particular, designation of the source region and the drain region of the access transistor is dependent on the voltage applied to a corresponding bit line and source line, wherein the region corresponding to a higher voltage is considered the drain region while the region corresponding to a lower voltage is considered the source region. An activation voltage applied to a word line electrically coupled to the gate region controls activation of the access transistor for write operations to generate a write current from a source line electrically coupled to the second region to the MTJ device electrically coupled to the first region. To reduce or avoid source degeneration caused by a voltage at the source region (e.g., the first region) of the access transistor in response to a write operation, a back gate bias voltage is applied to a back gate electrode of the access transistor. In particular, to overcome the effects of source degeneration, the back gate bias voltage is controlled to be greater than or equal to a back gate voltage associated with the access transistor having a nominal threshold voltage corresponding to operation without source degeneration plus a voltage corresponding to the source region of the access transistor. As used herein, a nominal threshold voltage of a transistor is defined as the threshold voltage achieved under on ideal operating conditions. In other words, the voltage applied to bias a back gate region of the access transistor is increased by at least the voltage at the source region. Increasing the voltage applied to the back gate region in this manner reduces a threshold voltage of the access transistor resulting in lower threshold voltage, thus resulting in an increase in write current applied to the MTJ device by the access transistor. Thus, applying the back gate bias voltage as described above can increases write current so as to reduce or avoid write operation failures in the MRAM bit cell without having to increase the area consumption of the MRAM bit cell.

Figure 2:
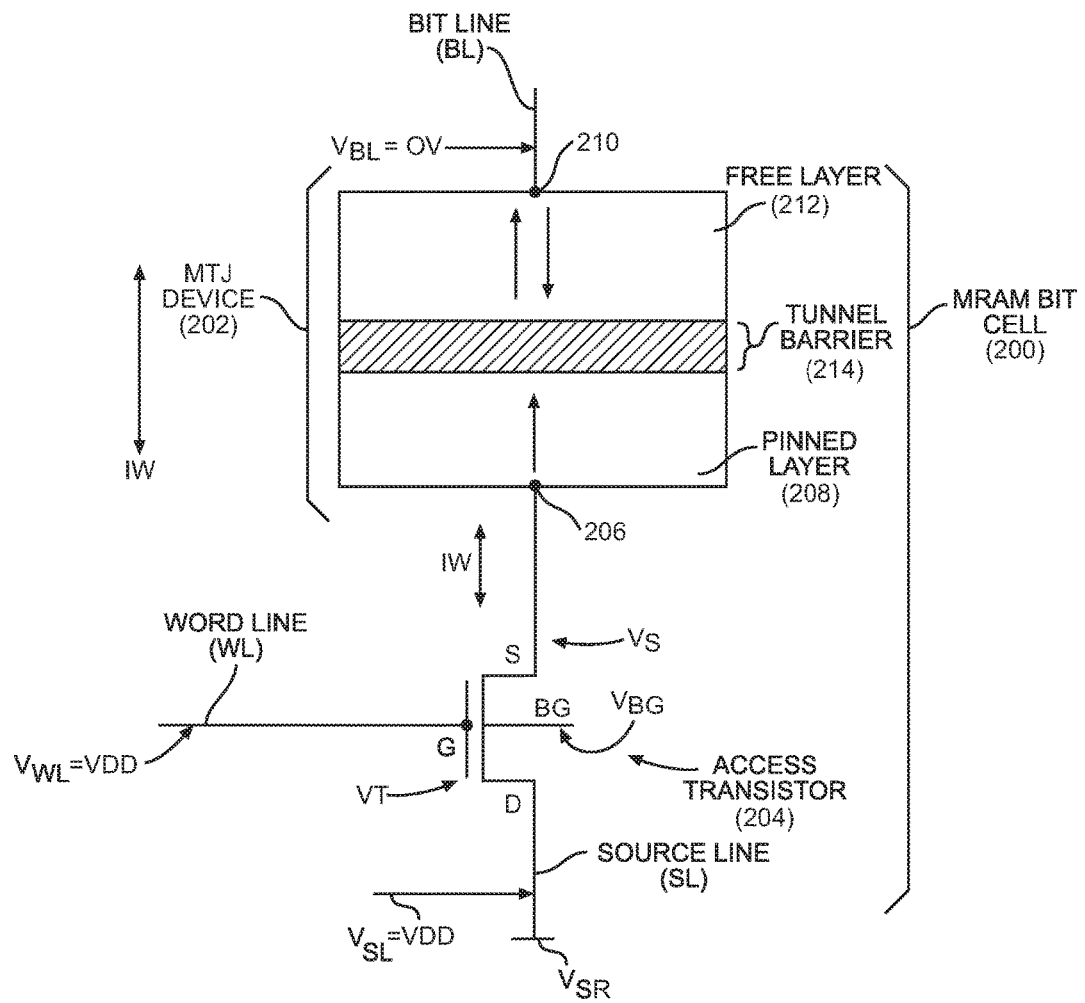
FIG. 2 is a diagram of an exemplary MRAM bit cell in the prior art experiencing source degeneration in response to a write operation.
Figure 3A:
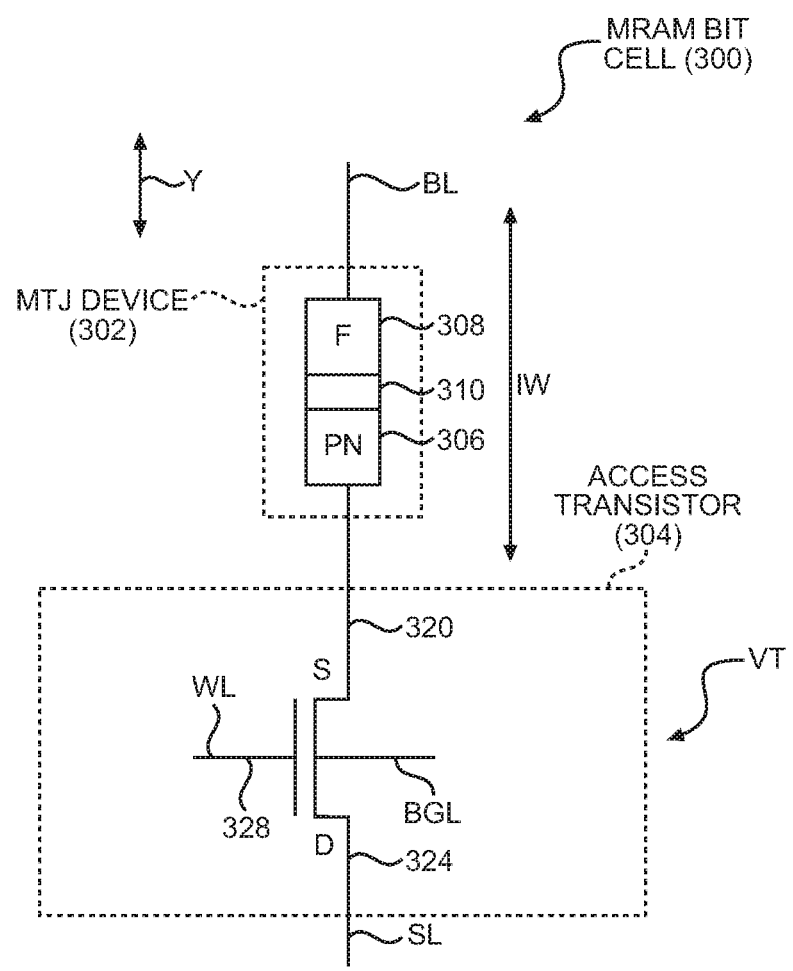
FIG. 3A is a circuit diagram of an exemplary MRAM bit cell configured for back gate biasing through an N-type doped material well (N-well) region to reduce or avoid write operation failures caused by source degeneration.

Before discussing back gate biasing MRAM bit cells to reduce or avoid write operation failures caused by source degeneration starting at FIG. 3A, details of source degeneration in an MRAM bit cell are first described starting at FIG. 2. In this regard, FIG. 2 illustrates an exemplary conventional MRAM bit cell 200 susceptible to source degeneration in response to a write operation. The MRAM bit cell 200 includes an MTJ device 202 and a metal-oxide semiconductor (MOS) (typically N-type MOS, i.e., NMOS) access transistor 204 provided to control reading and writing to the MTJ device 202. As discussed below, for a write operation that changes a magnetization orientation state of the MTJ device 202 from parallel (P) to anti-parallel (AP), a source region (S) of the access transistor 204 is coupled to a bottom electrode 206 of the MTJ device 202, which is coupled to a pinned layer 208 for example. A word line (WL) is coupled to a gate region (G) of the access transistor 204. Additionally, the access transistor 204 in this example is a four-terminal access transistor 204, and thus includes a back-gate region (BG). A drain region (D) of the access transistor 204 is coupled to a voltage source ($V_{SR}$) through a source line (SL), wherein the voltage source ($V_{SR}$) applies a source line voltage ($V_{SL}$) to the source line (SL). A bit line (BL) is coupled to a top electrode 210 of the MTJ device 202, which is coupled to a free layer 212 for example. The pinned layer 208 and the free layer 212 are separated by a tunnel barrier 214.

With continuing reference to FIG. 2, the MRAM bit cell 200 may suffer from source degeneration in response to a write operation to change the magnetization orientation state of the MTJ device 202 from P to AP. As used herein, source degeneration refers to a decrease in write current ($I_W$) as a result of an increased threshold voltage ($V_T$) of the access transistor 204 due to a voltage ($V_S$) present at the source region (S) of the access transistor 204 in response to a write operation. More specifically, in this example, a write operation that changes the magnetization orientation state of the MTJ device 202 from P to AP requires a stronger write current ($I_W$) compared to a write operation that changes the magnetization orientation state of the MTJ device 202 from AP to P. In this manner, a write operation that changes the magnetization orientation state of the MTJ device 202 from P to AP is referred to as a "high resistance" write operation.

With continuing reference to FIG. 2, to perform a write operation that changes the magnetization orientation state of the MTJ device 202 from P to AP, the gate region (G) of the access transistor 204 is activated by applying a word line voltage ($V_{WL}$) approximately equal to a supply voltage ($V_{DD}$) to the word line (WL). Additionally, the source line voltage ($V_{SL}$) on the source line (SL) is controlled to be approximately equal to the supply voltage ($V_{DD}$), while a bit line voltage ($V_{BL}$) on the bit line (BL) is controlled to be approximately 0 Volts (V) (i.e., ground). As a result, the write current ($I_W$) between the drain region (D) and the source region (S) of the access transistor 204 that flows from the pinned layer 208 to the free layer 212 that changes the magnetization orientation state of the MTJ device 202 from P to AP is produced. The write current ($I_W$) induces a spin-transfer torque (STT) at the free layer 212 to change the magnetic orientation of the free layer 212 to AP with respect to the pinned layer 208.

With continuing reference to FIG. 2, in the MRAM bit cell 200, the region of the access transistor 204 that corresponds to a higher voltage is considered the drain region (D), while the region corresponding to a lower voltage is considered the source region (S). In this example, a higher voltage (e.g., the supply voltage ($V_{DD}$)) is applied to the source line (SL) compared to the bit line (BL) (e.g., 0V). Thus, the source line (SL) is referred to as being coupled to the drain region (D) of the access transistor 204, and the pinned layer 208 is referred to as being coupled to the source region (S). The voltages applied for the write operation described above results in a voltage ($V_S$) present at the source region (S) of the access transistor 204. However, the threshold voltage ($V_T$) of the access transistor 204 is a function of a voltage differential between the back-gate region (BG) and the source region (S) (i.e., a back-gate-to-source voltage ($V_{BS}$)). In particular, the threshold voltage ($V_T$) of the access transistor 204 increases as the back-gate-to-source voltage ($V_{BS}$) decreases. Thus, when the voltage ($V_S$) is present at the source region (S), the back-gate-to-source voltage ($V_{BS}$) is reduced by the source voltage ($V_S$). The reduced back-gate-to-source voltage ($V_{BS}$) increases the threshold voltage ($V_T$), which decreases the write current ($I_W$). This source degeneration may reduce the write current ($I_W$) below the critical switching current ($I_C$) required to switch the magnetic orientation of the free layer 212, resulting in failure of the write operation that changes the magnetization orientation state of the MTJ device 202 from P to AP.

With continuing reference to FIG. 2, one way to avoid the effects of source degeneration in the MRAM bit cell 200 is to increase the write current ($I_W$) for write operations by increasing the size of the access transistor 204 so as to increase drive strength by reducing the resistance (R) of the access transistor 204. However, increasing the size of the access transistor 204 necessarily increases area consumption of the MRAM bit cell 200.

Figure 3B:
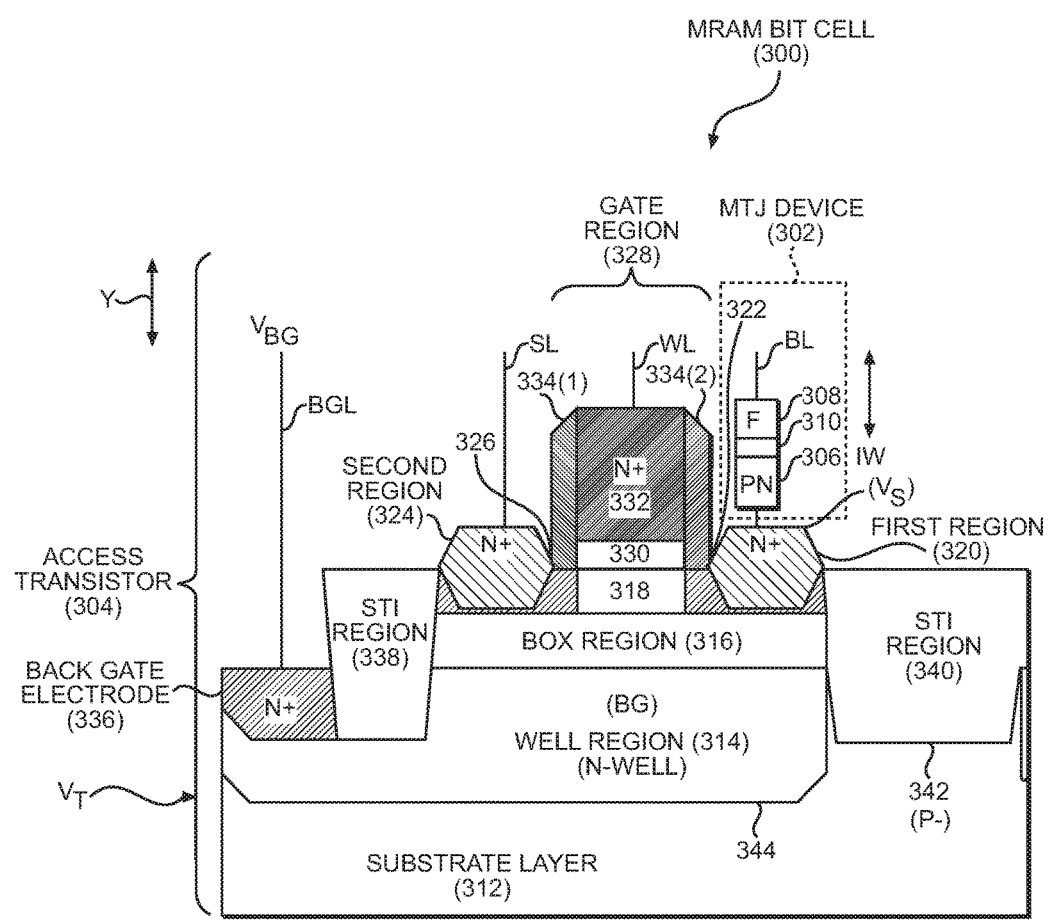
FIG. 3B is a cross-section diagram of the MRAM bit cell in FIG. 3A configured for back gate biasing through the N-well region to reduce or avoid write operation failures caused by source degeneration.

In this regard, FIGS. 3A and 3B illustrate an exemplary MRAM bit cell 300 configured for back gate biasing to reduce or avoid write operation failures caused by source degeneration. FIG. 3A illustrates a circuit view of the MRAM bit cell 300, while FIG. 3B illustrates a cross-sectional view of the MRAM bit cell 300. FIGS. 3A and 3B will be discussed in parallel.

In this regard, the MRAM bit cell 300 includes an MTJ device 302 and an access transistor 304 used to control reading and writing of the MRAM bit cell 300. The MTJ device 302 includes a first ferromagnetic layer 306, a second ferromagnetic layer 308, and a tunnel barrier 310 disposed between the first and second ferromagnetic layers 306, 308. In this aspect, the first ferromagnetic layer 306 is a pinned layer PN and the second ferromagnetic layer 308 is a free layer F, wherein the pinned layer PN is formed below the free layer F in a Y-axis direction (Y). In this manner, because the pinned layer PN is formed below the free layer F, the MTJ device 302 is referred to as a "bottom pin" MTJ device 302. However, as discussed in more detail below, other aspects may include a "top pin" MTJ device 302, wherein the first ferromagnetic layer 306 is a pinned layer PN formed above the second ferromagnetic layer 308 employed as a free layer F in the Y-axis direction (Y).

With continuing reference to FIGS. 3A and 3B, the access transistor 304 includes a substrate layer 312, a well region 314 formed over the substrate layer 312 in the Y-axis direction (Y), a buried oxide (BOX) region 316 formed over the well region 314 in the Y-axis direction (Y), and a channel region 318 formed over the BOX region 316 in the Y-axis direction (Y). As discussed in more detail below, while the well region 314 is an N-type doped material well (N-well) region in this aspect, other aspects may employ a P-type doped material well (P-well) region. Further, by forming the channel region 318 with respect to the BOX region 316, the access transistor 304 may be formed using a fully depleted (HD) silicon-on-insulator (SOI) (FD-SOI) process technology. It will be understood by a person having ordinary skill in the art that the access transistor 304 formed from an FD-SOI process technology has a larger back-gate biasing range compared to an access transistor formed from a conventional bulk process technology. As a non-limiting example, the back gate biasing range of an FD-SOI process technology may be between −3V and +3V, whereas the back gate biasing range of a bulk process technology may be between −300 mV and +300 mV.

With continuing reference to FIGS. 3A and 3B, the access transistor 304 also includes a first region 320 formed on a first side 322 of the channel region 318 and electrically coupled to the first ferromagnetic layer 306 of the MTJ device 302. Additionally, the access transistor 304 includes a second region 324 formed on a second side 326 of the channel region 318, and electrically coupled to a source line (SL). A gate region 328 is formed over the channel region 318 in the Y-axis direction (Y) between the first and second regions 320, 324 of the access transistor 304. In this aspect, the gate region 328 includes a high-k dielectric gate oxide layer 330, an N-type metal gate electrode layer 332, and spacers 334(1), 334(2). Additionally, the gate region 328 is electrically coupled to a word line (WL) used to activate the access transistor 304 for write operations so as to provide a write current ($I_W$) from the source line (SL) to the MTJ device 302. Further, the access transistor 304 also includes a back gate electrode 336 electrically coupled to the well region 314 and a back gate line (BGL) configured to apply a back gate bias voltage ($V_{BG}$) for write operations. In this aspect, the back gate electrode 336 is formed from an N-type doped material (N+), while the substrate layer 312 is formed from a P-type doped material (P−). To electrically isolate the back gate electrode 336 from the second region 324, the access transistor 304 includes a shallow trench isolation (STI) region 338 formed in the well region 314 between the back gate electrode 336 and the BOX region 316. To electrically isolate the first region 320 from other devices such as other MRAM bit cells, the MRAM bit cell 300 includes an STI region 340 formed in the substrate layer 312 adjacent to the first region 320 and the BOX region 316, wherein a bottom surface 342 of the STI region 340 is above a bottom surface 344 of the well region 314 in the Y-axis direction (Y).

With continuing reference to FIGS. 3A and 3B, to perform a write operation that changes the magnetization orientation state of the MTJ device 302 from P to AP, the gate region 328 of the access transistor 304 is activated by applying a word line voltage ($V_{WL}$) approximately equal to a supply voltage ($V_{DD}$) to the word line (WL). Additionally, the source line voltage ($V_{SL}$) on the source line (SL) is controlled to be approximately equal to the supply voltage ($V_{DD}$), while a bit line voltage ($V_{BL}$) on the bit line (BL) is controlled to be approximately 0 Volts (V) (i.e., ground). As a result, the write current ($I_W$) between the drain region (D) and the source region (S) of the access transistor 304 that flows from the first ferromagnetic layer 306 (i.e., the pinned layer PN) to the second ferromagnetic layer 308 (i.e., the free layer F) that changes the magnetization orientation state of the MTJ device 302 from P to AP is produced. The write current ($I_W$) induces an STT at the second ferromagnetic layer 308 (i.e., the free layer F) to change the magnetic orientation of the second ferromagnetic layer 308 (i.e., the free layer F) to AP with respect to the first ferromagnetic layer 308 (i.e., the pinned layer PN).

With continuing reference to FIGS. 3A and 3B, to reduce or avoid source degeneration caused by a voltage at a source region (S) of the access transistor 304 (e.g., either the first or second region 320, 324, depending on the orientation of the MTJ device 302) in response to a write operation such as the write operation described above, the back gate bias voltage ($V_{BG}$) is applied to the back gate electrode 336 of the access transistor 304 via the back gate line (BGL). In particular, to overcome the effects of source degeneration, the back gate bias voltage ($V_{BG}$) is controlled to be greater than or equal to a voltage ($V_b+V_S$), wherein the voltage ($V_b$) is defined as a back gate voltage associated with the access transistor 304 having a nominal threshold voltage ($V_T$) corresponding to operation without source degeneration, and the voltage ($V_S$) is defined as a voltage corresponding to a source region (S) of the access transistor 304. As a non-limiting example, if the first region 320 is the source region (S) having a voltage ($V_S$) equal to 0.4V, the back gate bias voltage ($V_{BG}$) is greater than or equal to ($V_b+0.4V$). Increasing a back-gate-to-source voltage ($V_{BS}$) in this manner reduces a threshold voltage ($V_T$) of the access transistor 304. In particular, the threshold voltage ($V_T$) decreases as the back-gate-to-source voltage ($V_{BS}$) increases. Thus, by increasing the back gate bias voltage ($V_{BG}$) by at least the voltage ($V_b+V_S$), the increased back-gate-to-source voltage ($V_{BS}$) effectively cancels out the source degeneration caused by the source voltage ($V_S$), which reduces the threshold voltage ($V_T$). A lower threshold voltage ($V_T$) results in an increased write current ($I_W$) provided from the access transistor 304 to the MTJ device 302. Thus, applying the back gate bias voltage ($V_{BG}$) as described above increases the write current ($I_W$) so as to reduce or avoid failures of write operations in the MRAM bit cell 300 without increasing the area consumption of the MRAM bit cell 300.

With continuing reference to FIGS. 3A and 3B, as another non-limiting example, the access transistor 304 may be designed to need a back gate bias voltage ($V_{BG}$) to achieve a particular threshold voltage ($V_T$) for read and write operations prior to factoring in source degeneration. In this scenario, the back gate bias voltage ($V_{BG}$) is increased by at least the voltage ($V_S$) of the source region (S) to mitigate the effects of source degeneration. For example, if the back gate voltage ($V_b$), without factoring in source degeneration, is equal to 1.0V and the voltage ($V_S$) of the source region (S) is equal to 0.4V, then the back gate bias voltage ($V_{BG}$) applied is controlled to be greater than or equal to 1.4V. As discussed above, some write operations may be "high resistance" write operations that suffer from source degeneration, while other "normal resistance" write operations do not. In this manner, as discussed in more detail below, the back gate bias voltage ($V_{GB}$) may have a higher value in response to a "high resistance" write operation. Thus, expanding on the example discussed above, the back gate bias voltage ($V_{BG}$) may be set to 1.0V for "normal resistance" write operations, and increased to 1.4V to factor in source degeneration in response to "high resistance" write operations.

Figure 4:
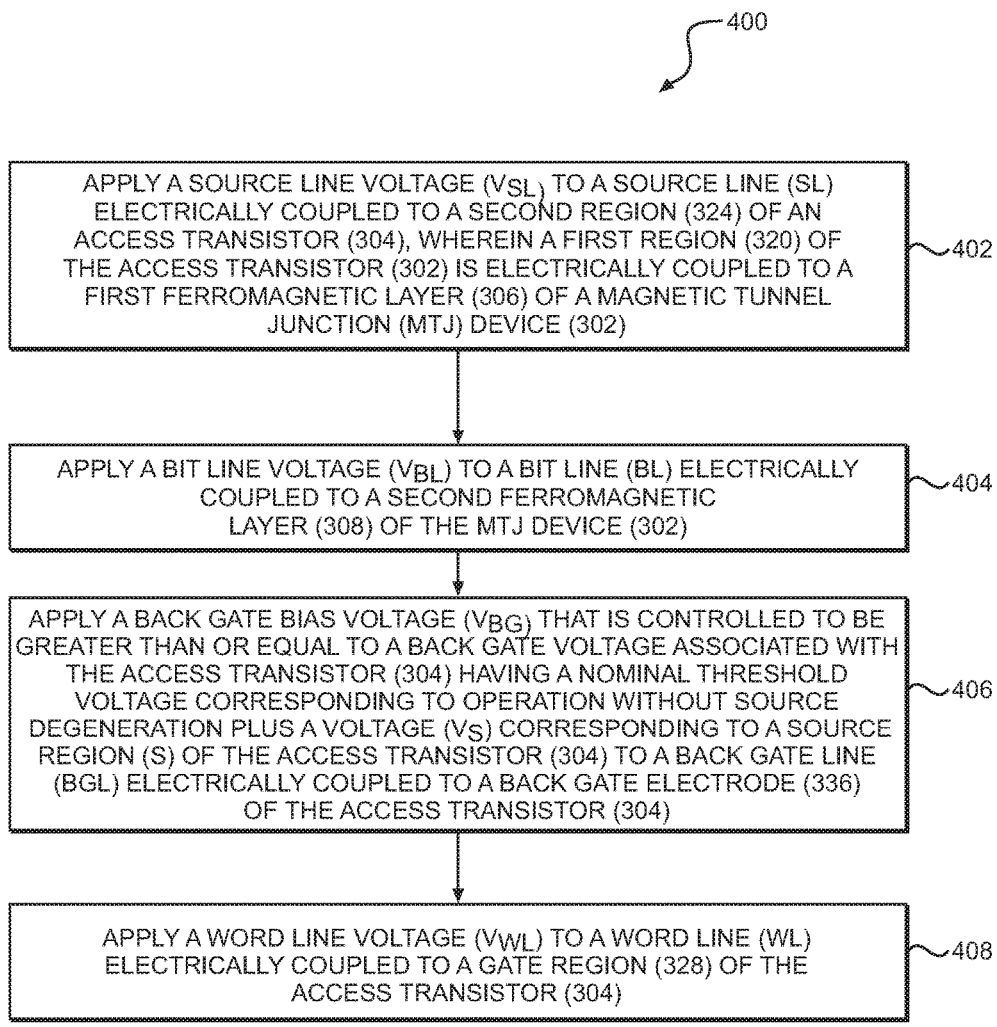
FIG. 4 is a flowchart illustrating a process for back gate biasing the MRAM bit cell in FIGS. 3A and 3B in response to a write operation to reduce or avoid write operation failures caused by source degeneration.

FIG. 4 illustrates a process 400 for back gate biasing the MRAM bit cell 300 in FIGS. 3A and 3B to reduce or avoid write operation failures caused by source degeneration. The process 400 includes applying a source line voltage ($V_{SL}$) to the source line (SL) electrically coupled to the second region 324 of the access transistor 304 (block 402). As described above, the first region 320 of the access transistor 304 is electrically coupled to the first ferromagnetic layer 306 of the MTJ device 302. The process 400 also includes applying a bit line voltage ($V_{BL}$) to the bit line (BL) electrically coupled to the second ferromagnetic layer 308 of the MTJ device 302 (block 404). Additionally, the process 400 includes applying the back gate bias voltage ($V_{BG}$) that is greater than or equal to a voltage ($V_b+V_S$) to the back gate line (BGL) electrically coupled to the back gate electrode 336 of the access transistor 304 (block 406). As described above, the voltage ($V_b$) is defined as a back gate voltage associated with the access transistor 304 having a nominal threshold voltage ($V_T$) corresponding to operation without source degeneration, and the voltage ($V_S$) is defined as a voltage corresponding to a source region (S) of the access transistor 304. The process 400 also includes applying a word line voltage ($V_{WL}$) to the word line (WL) electrically coupled to the gate region 328 of the access transistor 304 (block 408). Performing the write operation described by the process 400 results in an increased back-gate-to-source voltage ($V_{BS}$) of the access transistor 304 to effectively cancel out the source degeneration caused by the source voltage ($V_S$), which reduces the threshold voltage ($V_T$). A lower threshold voltage ($V_T$) results in an increased write current ($I_W$) provided from the access transistor 304 to the MTJ device 302 without an increase in area consumption of the MRAM bit cell 300 so as to reduce or avoid write operation failures caused by source degeneration.

Figure 5:
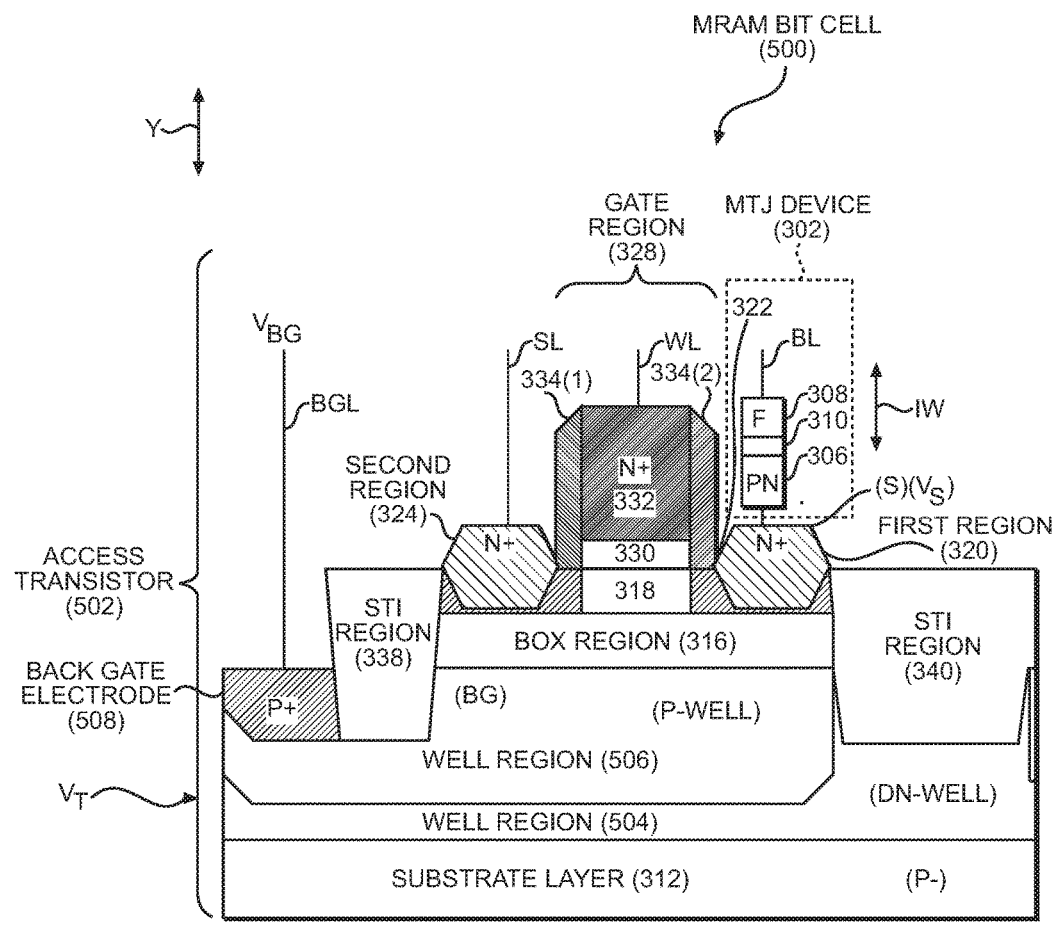
FIG. 5 is a cross-sectional diagram of another exemplary MRAM bit cell configured for back gate biasing through a P-type doped material well (P-well) region to reduce or avoid write operation failures caused by source degeneration.

As noted above, while the access transistor 304 in the MRAM bit cell 300 of FIGS. 3A and 3B employs an N-well region as the well region 314, other aspects may instead employ a P-well region. In this regard, FIG. 5 is a cross-sectional view of an exemplary MRAM bit cell 500 configured for back gate biasing through a P-well region to reduce or avoid write operation failures caused by source degeneration. The MRAM bit cell 500 includes common elements with the MRAM bit cell 300 in FIG. 3B, which are referred to with common element numbers in FIG. 3B and FIG. 5, and thus will not re-described herein.

With continuing reference to FIG. 5, the MRAM bit cell 500 includes an MTJ device 302 and an access transistor 502 used to control reading and writing to the MRAM bit cell 500. The access transistor 502 includes a substrate layer 312, a well region 504 formed over the substrate layer 312 in a Y-axis direction (Y), a well region 506 formed over the well region 504 in the Y-axis direction (Y), a BOX region 316 formed over the well region 506 in the Y-axis direction (Y), and a channel region 318 formed over the BOX region 316 in the Y-axis direction (Y). Additionally, the access transistor 502 includes a back gate electrode 508 electrically coupled to the well region 506 so as to apply a back gate bias voltage ($V_{BG}$) controlled to be greater than or equal to a voltage ($V_b + V_S$), wherein the voltage ($V_b$) is defined as a back gate voltage associated with the access transistor 502 having a nominal threshold voltage ($V_T$) corresponding to operation without source degeneration, and the voltage ($V_S$) is defined as a voltage ($V_S$) corresponding to a source region (S) of the access transistor 502. More specifically, in this aspect, the well region 506 is a P-well region, as opposed to an N-well region. To employ the well region 506 as the P-well region when the substrate layer 312 is formed from a P-type doped material, the access transistor 502 also includes the well region 504 formed as a deep N-well (DN-well) region. Additionally, the back gate electrode 508 is formed using a P-type doped material (P+) rather than an N-type doped material (N+) of the back gate electrode 336 in FIG. 3B. However, similar to the access transistor 304 in FIG. 3B, by forming the channel region 318 with respect to the BOX region 316, the access transistor 502 may be formed using an FD-SOI process technology. Employing the MRAM bit cell 500 provides an option to increase a write current ($I_W$) provided from the access transistor 502 to the MTJ device 302 without an increase in area consumption of the MRAM bit cell 500.

Figure 6A:
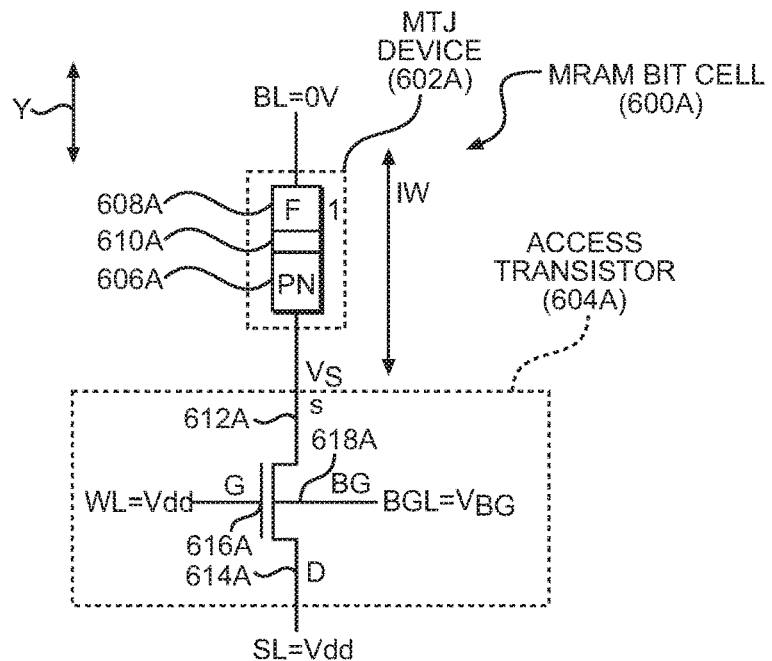
FIG. 6A is a circuit diagram of an exemplary normal connection MRAM bit cell configured for back gate biasing to reduce or avoid write operation failures caused by source degeneration.

To provide additional clarification of the MRAM bit cells configured for back gate biasing to reduce or avoid write operation failures caused by source degeneration, circuit diagrams illustrating multiple configurations of the MRAM bit cells are now provided. In this regard, FIG. 6A illustrates a circuit diagram of an exemplary MRAM bit cell 600A that includes an MTJ device 602A and an access transistor 604A used to create a voltage differential across the MTJ device 602A for writing the MRAM bit cell 600A. The MTJ device 602A includes a first ferromagnetic layer 606A, a second ferromagnetic layer 608A, and a tunnel barrier 610A disposed between the first and second ferromagnetic layers 606A, 608A. In this aspect, the first ferromagnetic layer 606A is a pinned layer PN and the second ferromagnetic layer 608A is a free layer F, wherein the pinned layer PN is formed below the free layer F in a Y-axis direction. In this manner, the MTJ device 602A is referred to as a "bottom pin" MTJ device 602A.

With continuing reference to FIG. 6A, the access transistor 604A includes a first region 612A electrically coupled to the first ferromagnetic layer 606A, a second region 614A electrically coupled to a source line (SL), and a gate region 616A electrically coupled to a word line (WL). Further, the access transistor 604A includes a back gate electrode 618A electrically coupled to a back gate line (BGL) configured to apply a back gate bias voltage ($V_{BG}$) controlled to be greater than or equal to a voltage ($V_b + V_S$), wherein the voltage ($V_b$) is defined as a back gate voltage associated with the access transistor 604A having a nominal threshold voltage ($V_T$) corresponding to operation without source degeneration, and the voltage ($V_S$) is defined as a voltage ($V_S$) corresponding to a source region (S) of the access transistor 604A. In this manner, the configuration of the MRAM bit cell 600A is referred to as a "normal connection" because the access transistor 604A is electrically coupled to the pinned layer PN of the MTJ device 602A. Further, because the MRAM bit cell 600A is configured using a "normal connection," a write operation that changes the magnetization orientation state of the MTJ device 602A from P to AP requires a stronger write current ($I_W$) compared to a write operation that changes the magnetization orientation state of the MTJ device 602A from AP to P. In this manner, a write operation that changes the magnetization orientation state of the MTJ device 602A from P to AP is referred to as a "high resistance" write operation. To perform such a write operation, a supply voltage ($V_{DD}$) is applied to the source line (SL) and a word line (WL), and 0V are applied to a bit line (BL). As a result, the first region 612A is the source region (S) of the access transistor 604A. Thus, the back gate bias voltage ($V_{BG}$) is configured to be greater than or equal to a voltage ($V_b + V_S$) to increase the write current ($I_W$) without an increase in area consumption of the MRAM bit cell 600A so as to reduce or avoid write operation failures caused by source degeneration.

Figure 6B:
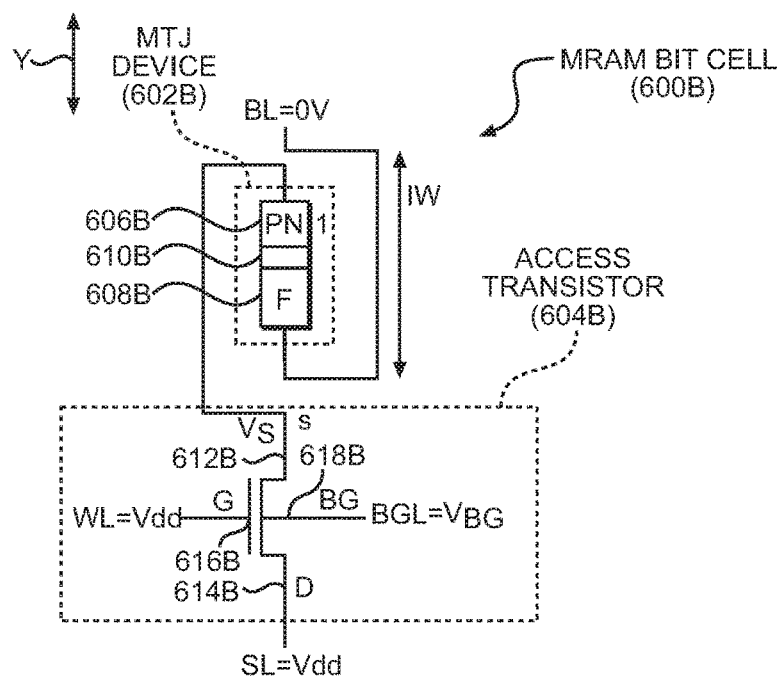
FIG. 6B is a circuit diagram of another exemplary normal connection MRAM bit cell configured for back gate biasing to reduce or avoid write operation failures caused by source degeneration.

FIG. 6B illustrates a circuit diagram of another exemplary MRAM bit cell 600B that includes an MTJ device 602B and an access transistor 604B used to create a voltage differential across the MTJ device 602B for writing the MRAM bit cell 600B. The MTJ device 602B includes a first ferromagnetic layer 606B, a second ferromagnetic layer 608B, and a tunnel barrier 610B disposed between the first and second ferromagnetic layers 606B, 608B. In this aspect, the first ferromagnetic layer 606B is a pinned layer PN and the second ferromagnetic layer 608B is a free layer F, wherein the pinned layer PN is formed above the free layer F in a Y-axis direction (Y). In this manner, the MTJ device 602B is referred to as a "top pin" MTJ device 602B.

With continuing reference to FIG. 6B, the access transistor 604B includes a first region 612B electrically coupled to the first ferromagnetic layer 606B, a second region 614B electrically coupled to a source line (SL), and a gate region 616B electrically coupled to a word line (WL). Further, the access transistor 604B includes a back gate electrode 618B electrically coupled to a back gate line (BGL) configured to apply a back gate bias voltage ($V_{BG}$) controlled to be greater than or equal to a voltage ($V_b + V_S$), wherein the voltage ($V_b$) is defined as a back gate voltage associated with the access transistor 604B having a nominal threshold voltage ($V_T$) corresponding to operation without source degeneration, and the voltage ($V_S$) is defined as a voltage ($V_S$) corresponding to a source region (S) of the access transistor 604B. In this manner, the configuration of the MRAM bit cell 600B is referred to as a "normal connection" because the access transistor 604B is electrically coupled to the pinned layer PN of the MTJ device 602B. Further, because the MRAM bit cell 600B is configured using a "normal connection," a write operation that changes the magnetization orientation state of the MTJ device 602B from P to AP is referred to as a "high resistance" write operation. To perform such a write operation, a supply voltage ($V_{DD}$) is applied to the source line (SL) and a word line (WL), and 0V are applied to a bit line (BL). As a result, the first region 612B is the source region (S) of the access transistor 604B. Thus, the back gate bias voltage ($V_{BG}$) is configured to be greater than or equal to the voltage ($V_b+V_S$) to increase the write current ($I_W$) without an increase in area consumption of the MRAM bit cell 600B so as to reduce or avoid write operation failures caused by source degeneration.

Figure 7A:
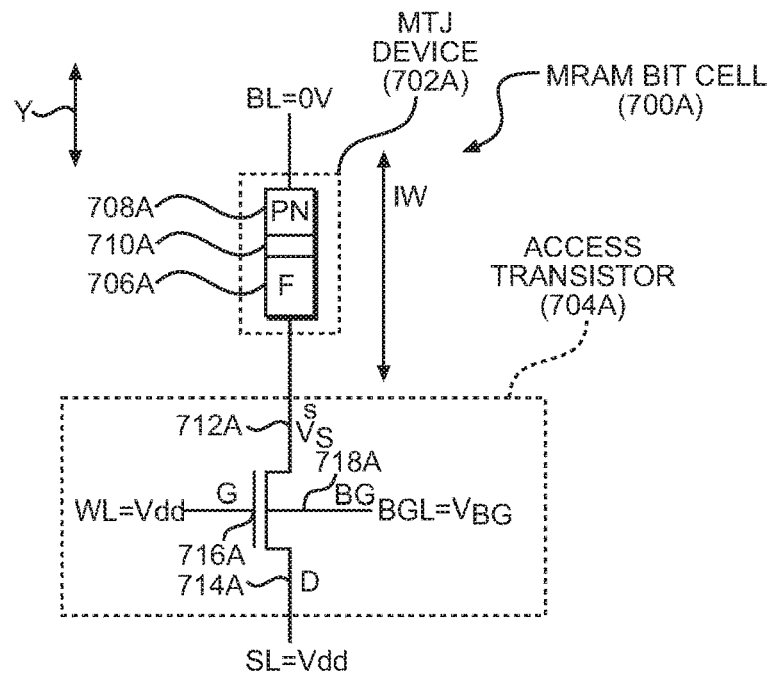
FIG. 7A is a circuit diagram of an exemplary reverse connection MRAM bit cell configured for back gate biasing to reduce or avoid write operation failures caused by source degeneration.

FIG. 7A illustrates a circuit diagram of another exemplary MRAM bit cell 700A that includes an MTJ device 702A and an access transistor 704A used to control reading and writing to the MRAM bit cell 700A. The MTJ device 702A includes a first ferromagnetic layer 706A, a second ferromagnetic layer 708A, and a tunnel barrier 710A disposed between the first and second ferromagnetic layers 706A, 708A. In this aspect, the first ferromagnetic layer 706A is a free layer F and the second ferromagnetic layer 708A is a pinned layer PN, wherein the pinned layer PN is formed above the free layer F in a Y-axis direction (Y). In this manner, the MTJ device 702A is referred to as a "top pin" MTJ device 702A.

With continuing reference to FIG. 7A, the access transistor 704A includes a first region 712A electrically coupled to the first ferromagnetic layer 706A, a second region 714A electrically coupled to a source line (SL), and a gate region 716A electrically coupled to a word line (WL). Further, the access transistor 704A includes a back gate electrode 718A electrically coupled to a back gate line (BGL) configured to apply a back gate bias voltage ($V_{BG}$) controlled to be greater than or equal to a voltage ($V_b+V_S$), wherein the voltage ($V_b$) is defined as a back gate voltage associated with the access transistor 704A having a nominal threshold voltage ($V_T$) corresponding to operation without source degeneration, and the voltage ($V_S$) is defined as a voltage ($V_S$) corresponding to a source region (S) of the access transistor 704A. In this manner, the configuration of the MRAM bit cell 700A is referred to as a "reverse connection" because the access transistor 704A is electrically coupled to the free layer F of the MTJ device 702A. Further, because the MRAM bit cell 700A is configured using a "reverse connection," a write operation that changes the magnetization orientation state of the MTJ device 702A from AP to P requires a stronger write current ($I_W$) compared to a write operation that changes the magnetization orientation state of the MTJ device 702A from P to AP. In this manner, a write operation that changes the magnetization orientation state of the MTJ device 702A from AP to P is referred to as a "high resistance" write operation. To perform such a write operation, a supply voltage ($V_{DD}$) is applied to the source line (SL) and a word line (WL), and 0V are applied to a bit line (BL). As a result, the first region 712A is the source region (S) of the access transistor 704A. Thus, the back gate bias voltage ($V_{BG}$) is configured to be greater than or equal to a voltage ($V_b+V_S$) to increase the write current ($I_W$) without an increase in area consumption of the MRAM bit cell 700A so as to reduce or avoid write operation failures caused by source degeneration.

Figure 7B:
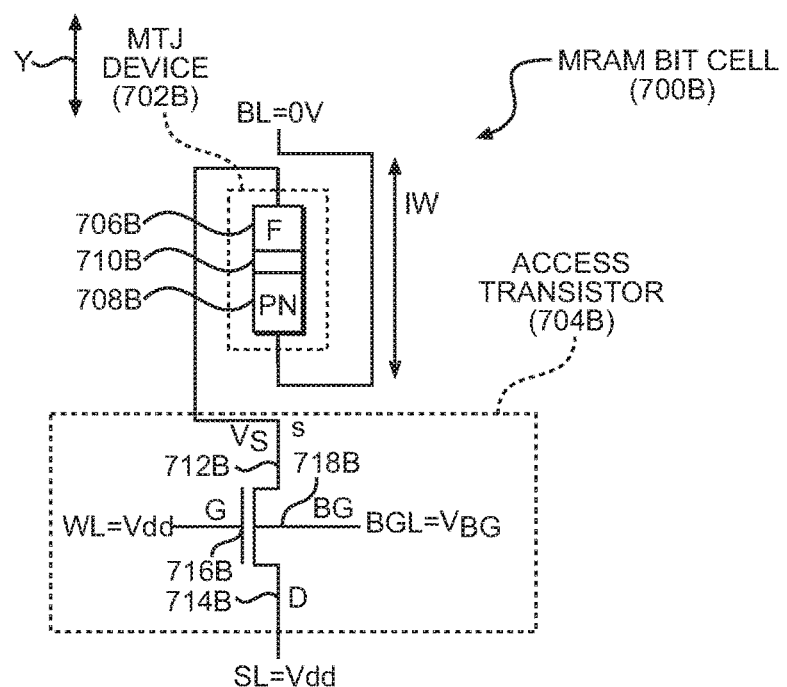
FIG. 7B is a circuit diagram of another exemplary reverse connection MRAM bit cell configured for back gate biasing to reduce or avoid write operation failures caused by source degeneration.

FIG. 7B illustrates a circuit diagram of another exemplary MRAM bit cell 700B that includes an MTJ device 702B and an access transistor 704B used to control reading and writing to the MRAM bit cell 700B. The MTJ device 702B includes a first ferromagnetic layer 706B, a second ferromagnetic layer 708B, and a tunnel barrier 710B disposed between the first and second ferromagnetic layers 706B, 708B. In this aspect, the first ferromagnetic layer 706B is a free layer F and the second ferromagnetic layer 708B is a pinned layer PN, wherein the pinned layer PN is formed below the free layer F in a Y-axis direction. In this manner, the MTJ device 702B is referred to as a "bottom pin" MTJ device 702B.

With continuing reference to FIG. 7B, the access transistor 704B includes a first region 712B electrically coupled to the first ferromagnetic layer 706B, a second region 714B electrically coupled to a source line (SL), and a gate region 716B electrically coupled to a word line (WL). Further, the access transistor 704B includes a back gate electrode 718B electrically coupled to a back gate line (BGL) configured to apply a back gate bias voltage ($V_{BG}$) controlled to be greater than or equal to a voltage ($V_b+V_S$), wherein the voltage ($V_b$) is defined as a back gate voltage associated with the access transistor 704B having a nominal threshold voltage ($V_T$) corresponding to operation without source degeneration, and the voltage ($V_S$) is defined as a voltage ($V_S$) corresponding to a source region (S) of the access transistor 704B. In this manner, the configuration of the MRAM bit cell 700B is referred to as a "reverse connection" because the access transistor 704B is electrically coupled to the free layer F of the MTJ device 702B. Further, because the MRAM bit cell 700B is configured using a "reverse connection," a write operation that changes the magnetization orientation state of the MTJ device 702B from AP to P is referred to as a "high resistance" write operation. To perform such a write operation, a supply voltage ($V_{DD}$) is applied to the source line (SL) and a word line (WL), and 0V are applied to a bit line (BL). As a result, the first region 712B is the source region (S) of the access transistor 704B. Thus, the back gate bias voltage ($V_{BG}$) is configured to be greater than or equal to the voltage ($V_b+V_S$) to increase the write current ($I_W$) without an increase in area consumption of the MRAM bit cell 700B so as to reduce or avoid write operation failures caused by source degeneration.

Figure 8:
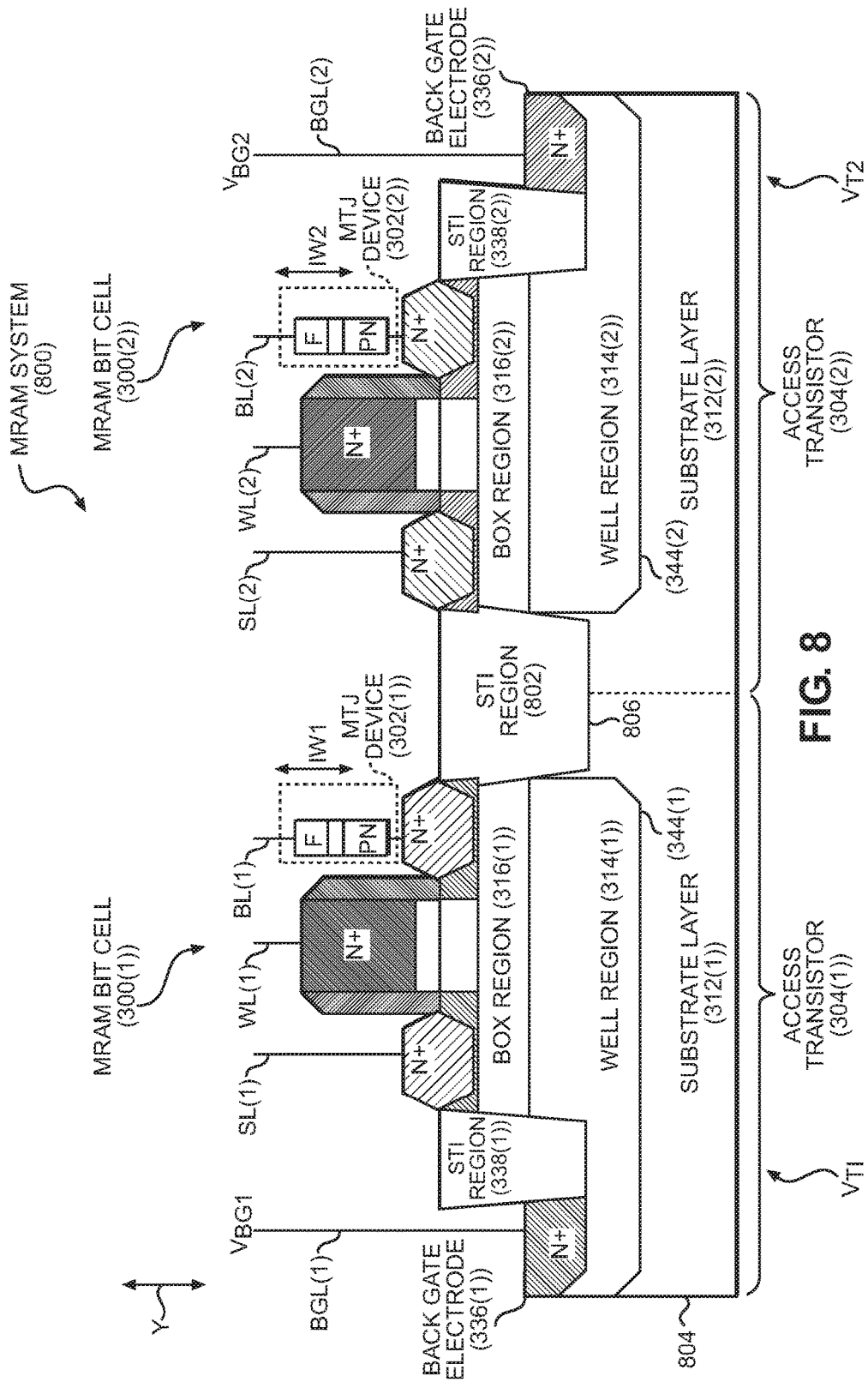
FIG. 8 is a cross-sectional diagram of an exemplary MRAM system that includes MRAM bit cells configured for back gate biasing to reduce or avoid write operation failures caused by source degeneration and that are electrically isolated by an shallow trench isolation (STI) region.

In addition to the single MRAM bit cells 300, 500, described above in FIGS. 3 and 5, respectively, multiple MRAM bit cells can be employed in an MRAM system. In this regard, FIG. 8 is a cross-sectional view of an exemplary MRAM system 800 that includes multiple MRAM bit cells 300(1), 300(2) configured for back gate biasing to reduce or avoid effects of source degeneration for increased write current ($I_W$), wherein the MRAM bit cells 300(1), 300(2) are electrically isolated by an STI region 802. The MRAM bit cells 300(1), 300(2) of the MRAM system 800 include common elements with the MRAM bit cell 300 in FIG. 3B, which are referred to with common element numbers in FIG. 3B and FIG. 8, and thus will not re-described herein. In particular, element numbers in FIG. 8 are common to element numbers in FIG. 3B, but are also appended with either (1) or (2) to indicate inclusion in the corresponding MRAM bit cell 300(1), 300(2).

With continuing reference to FIG. 8, each MRAM bit cell 300(1), 300(2) includes a corresponding substrate layer 312(1), 312(2), which is employed as a single substrate layer 804 in this aspect. Each MRAM bit cell 300(1), 300(2) also includes a corresponding access transistor 304(1), 304(2), a corresponding BOX region 316(1), 316(2), and a corresponding STI region 338(1), 338(2). Additionally, the MRAM system 800 includes the STI region 802 formed between the MRAM bit cells 300(1), 300(2). The STI region 802 electrically isolates the MRAM bit cells 300(1), 300(2) from one another such that a back gate bias voltage ($V_{BG1}$), ($V_{BG2}$) applied via a corresponding back gate electrode 336(1), 336(2) affects a threshold voltage ($V_{T1}$), ($V_{T2}$) and thus write current ($I_{W1}$), ($I_{W2}$) of a corresponding access transistor 304(1), 304(2). In other words, each back gate electrode 336(1), 336(2) can be used to independently tune each corresponding MRAM bit cell 300(1), 300(2). In this manner, the STI region 802 is similar to the STI region 340 of FIG. 3B. However, rather than employing a single STI region 340 for each MRAM bit cell 300(1), 300(2), the STI region 802 is shared between the MRAM bit cells 300(1), 300(2), wherein a bottom surface 806 of the STI region 802 is above bottom surfaces 344(1), 344(2) of the MRAM bit cells 300(1), 300(2) in a Y-axis direction (Y).

Figure 9:
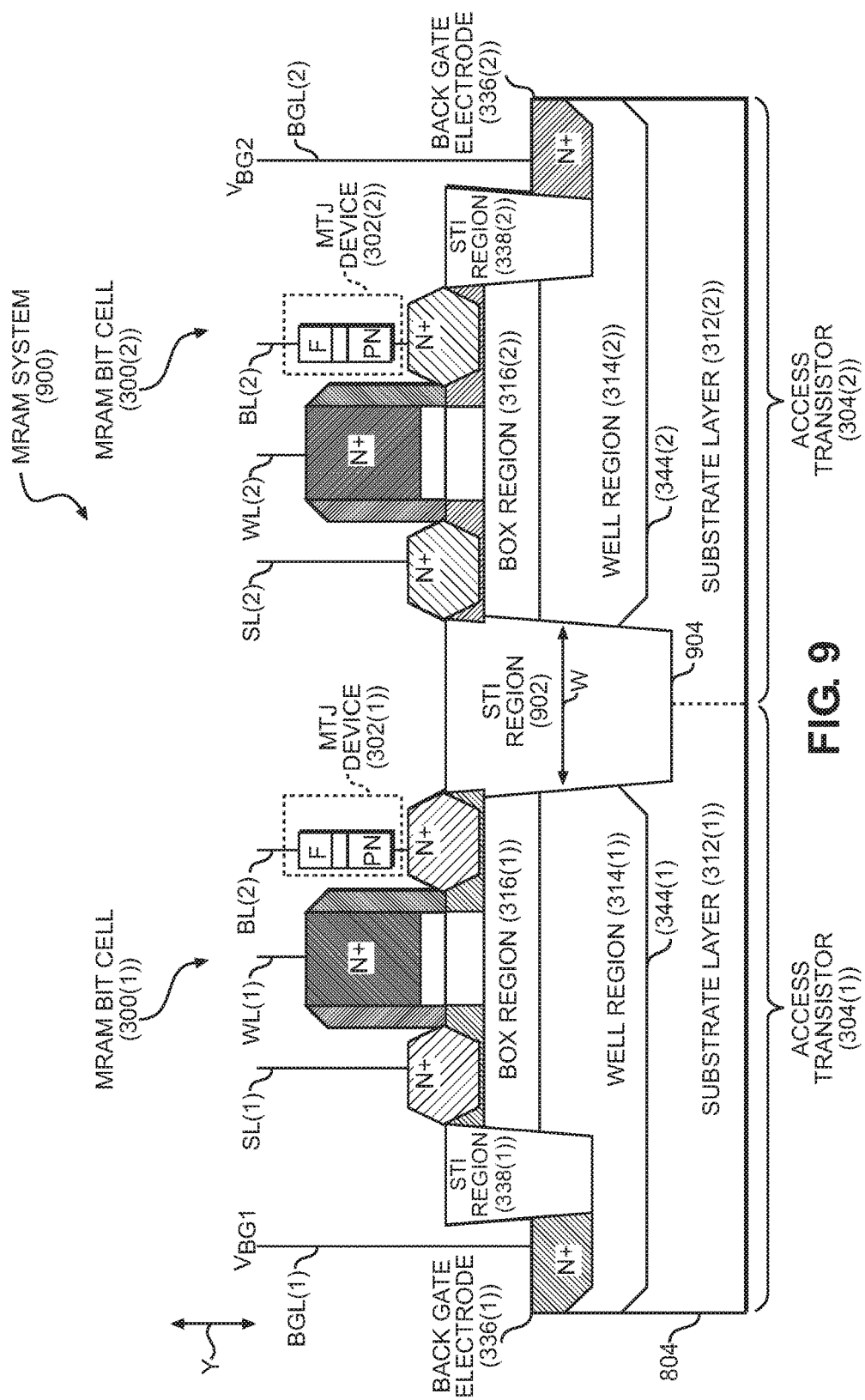
FIG. 9 is a cross-sectional diagram of another exemplary MRAM system that includes MRAM bit cells configured for back gate biasing to reduce or avoid write operation failures caused by source degeneration and that are electrically isolated by an STI region.

MRAM systems may incorporate alternative design choices to those of the MRAM system 800 in FIG. 8 to reduce area consumption. In this regard, FIG. 9 is a cross-sectional view of another exemplary MRAM system 900 that includes multiple MRAM bit cells 300(1), 300(2) configured for back gate biasing to reduce or avoid effects of source degeneration for increased write current ($I_W$). The MRAM system 900 includes common elements with the MRAM system 800 of FIG. 8, which are referred to with common element numbers in FIG. 8 and FIG. 9, and thus will not re-described herein. For example, each MRAM bit cell 300(1), 300(2) includes a corresponding access transistor 304(1), 304(2), a corresponding substrate layer 312(1), 312(2) employed as a single substrate layer 804, a corresponding BOX region 316(1), 316(2), and a corresponding STI region 338(1), 338(2).

The MRAM bit cells 300(1), 300(2) in the MRAM system 900 are electrically isolated by an STI region 902 having a bottom surface 904 lower than the bottom surfaces 344(1), 344(2) of the well regions 314(1), 314(2) in a Y-axis direction (Y). Forming the STI region 902 such that the bottom surface 904 is deeper than the bottom surfaces 344(1), 344(2) allows the MRAM system 900 to consume less area compared to employing the STI region 802 of FIG. 8. In particular, employing the STI region 902 in this manner allows the well regions 314(1), 314(2) to be formed from a single well region that is divided by the STI region 902. In contrast, by forming the bottom surface 806 above the bottom surfaces 344(1), 344(2) in FIG. 8 in the Y-axis direction (Y), process technology rules that control spacing of well regions require the well regions 314(1), 314(2) to be spaced further apart than a width W of the STI region 902. Thus, the MRAM system 900 may be employed to reduce or avoid failure of write operations caused by source degeneration while further reducing area consumption.

Figure 10:
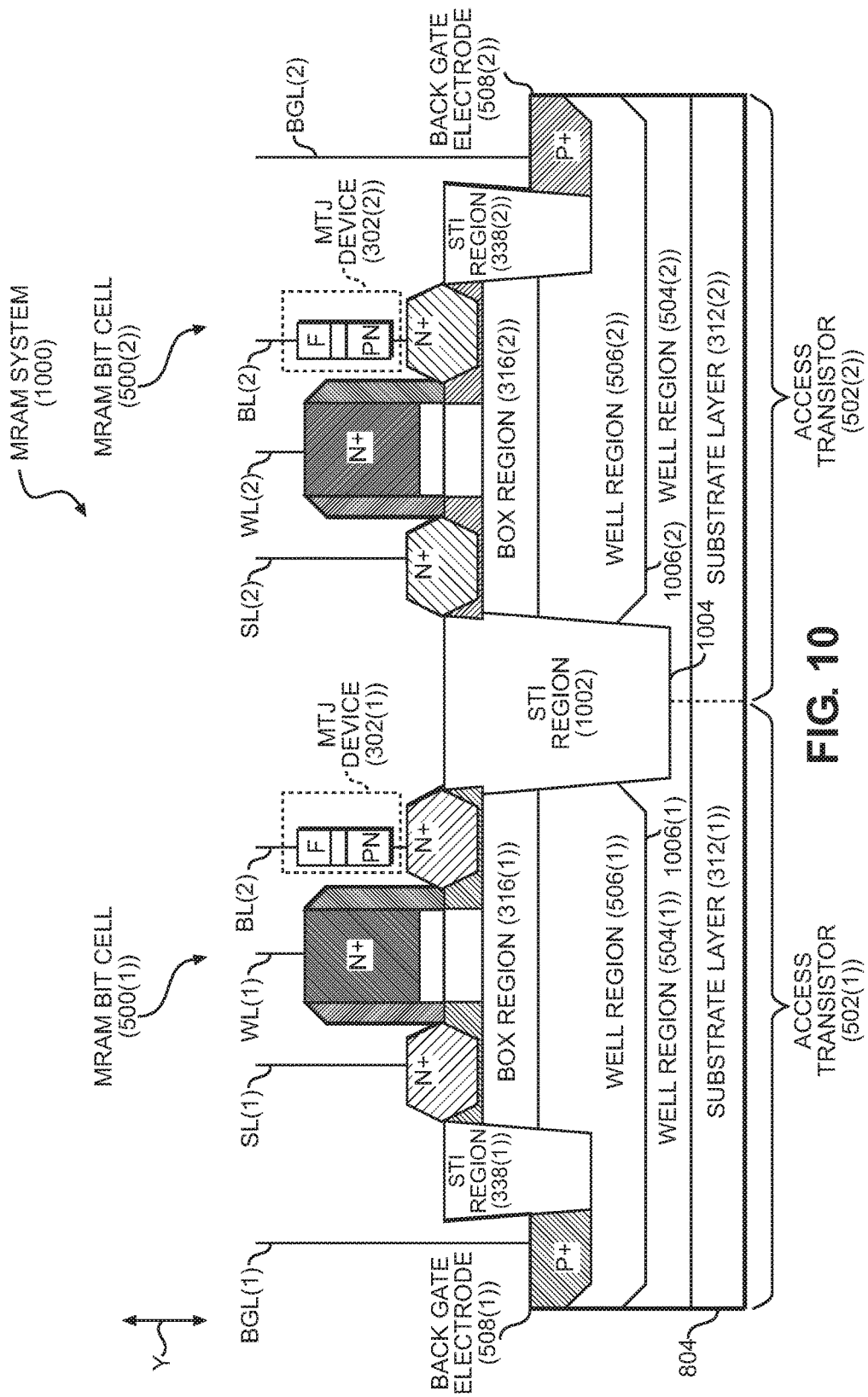
FIG. 10 is a cross-sectional diagram of another exemplary MRAM system that includes MRAM bit cells configured for back gate biasing to reduce or avoid write operation failures caused by source degeneration and that are electrically isolated by an STI region.

In addition to the MRAM systems 800, 900 of FIGS. 8 and 9, respectively, that employ the well regions 314(1), 314(2) as N-well regions, MRAM systems may also employ MRAM bit cells that include P-well regions. In this regard, FIG. 10 is a cross-sectional view of an exemplary MRAM system 1000 that includes multiple MRAM bit cells 500(1), 500(2) configured for back gate biasing to reduce or avoid effects of source degeneration for increased write current ($I_W$), wherein the MRAM bit cells 500(1), 500(2) are electrically isolated by an STI region 1002. The MRAM bit cells 500(1), 500(2) of the MRAM system 1000 include common elements with the MRAM bit cell 500 in FIG. 5, which are referred to with common element numbers in FIG. 5 and FIG. 10, and thus will not re-described herein. In particular, element numbers in FIG. 10 are common to element numbers in FIG. 5, but are also appended with either (1) or (2) to indicate inclusion in the corresponding MRAM bit cell 500(1), 500(2). For example, each MRAM bit cell 500(1), 500(2) also includes a corresponding access transistor 502(1), 502(2), a corresponding substrate layer 312(1), 312(2) employed as a single substrate layer 804, a corresponding BOX region 316(1), 316(2), and a corresponding STI region 338(1), 338(2). Further, the STI region 1002 has a bottom surface 1004 lower than bottom surfaces 1006(1), 1006(2) of the well regions 506(1), 506(2) in a Y-axis direction (Y), which allows the MRAM system 1000 to consume less area compared to employing the STI region 802 of FIG. 8 for reasons discussed with reference to the STI region 902 of FIG. 9. However, the MRAM system 1000 may employ an STI region 1002 having a bottom surface 1004 above the bottom surfaces 1006(1), 1006(2) in the Y-axis direction (Y) if needed in light of other design considerations.

Figure 11:
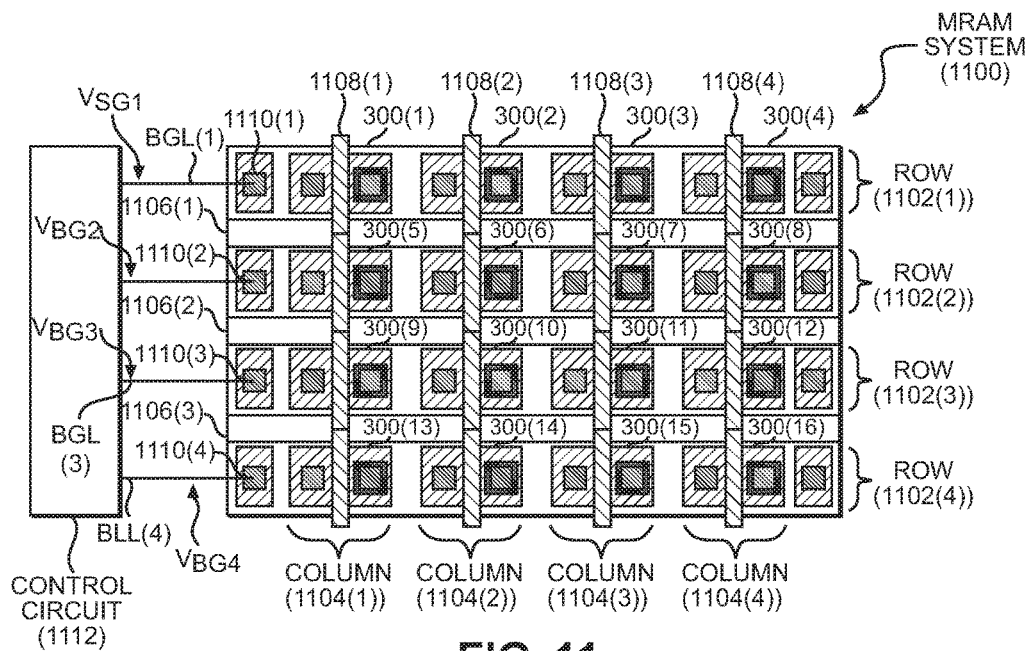
FIG. 11 is a top-view diagram of an exemplary MRAM system that includes MRAM bit cells configured for back gate biasing to reduce or avoid write operation failures caused by source degeneration and that are electrically isolated by an STI region.

FIG. 11 is a top-view of an exemplary MRAM system 1100 that includes MRAM bit cells 300(1)-300(16) configured for back gate biasing to reduce or avoid write operation failures caused by source degeneration. The MRAM system 1100 is designed such that the MRAM bit cells 300(1)-300(16) are divided into rows 1102(1)-1102(4) and columns 1104(1)-1104(4). While this aspect includes sixteen (16) MRAM bit cells 300(1)-300(16), four (4) rows 1102(1)-1102(4), and four (4) columns 1104(1)-1104(4), other aspects may include any number A of MRAM bit cells 300, any number B of rows 1102, and any number C of columns 1104. In this aspect, the MRAM bit cells 300(1)-300(16) of each row 1102(1)-1102(4) are electrically isolated by an STI trench 1106(1)-1106(3). Each column 1104(1)-1104(4) includes a gate 1108(1)-1108(4) shared by each MRAM bit cell 300(1)-300(16) in the corresponding column 1104(1)-1104(4). Additionally, each row 1102(1)-1102(4) includes a corresponding tap 1110(1)-1110(4) electrically coupled to a control circuit 1112 configured to apply a corresponding back gate bias voltage ($V_{BG1}$)-($V_{BG4}$) to a back gate line (BGL(1))-(BGL(4)) of each corresponding row 1102(1)-1102(4). In this manner, each back gate line (BGL(1))-(BGL(4)) is electrically coupled to each MRAM bit cell 300(1)-300(16) of each corresponding row 1102(1)-1102(4). The control circuit 1112 can be configured to apply the back gate bias voltage ($V_{BG1}$)-($V_{BG4}$) for every write operation. Alternatively, to reduce power consumption, the control circuit 1112 can also be configured to apply the back gate bias voltage ($V_{BG1}$)-($V_{BG4}$) only in response to a "high resistance" write operation, as previously described. In other words, the control circuit 1112 can be configured to apply a "smart" back gate bias voltage ($V_{BG1}$)-($V_{BG4}$) to reduce or avoid write operation failures caused by source degeneration. Applying the increased back gate bias voltage($V_{BG1}$)-($V_{BG4}$) only in response to "high resistance" write operations consumes less power compared to applying the increased back gate bias voltage ($V_{BG1}$)-($V_{BG4}$) in response to all write operations.

Figure 12:
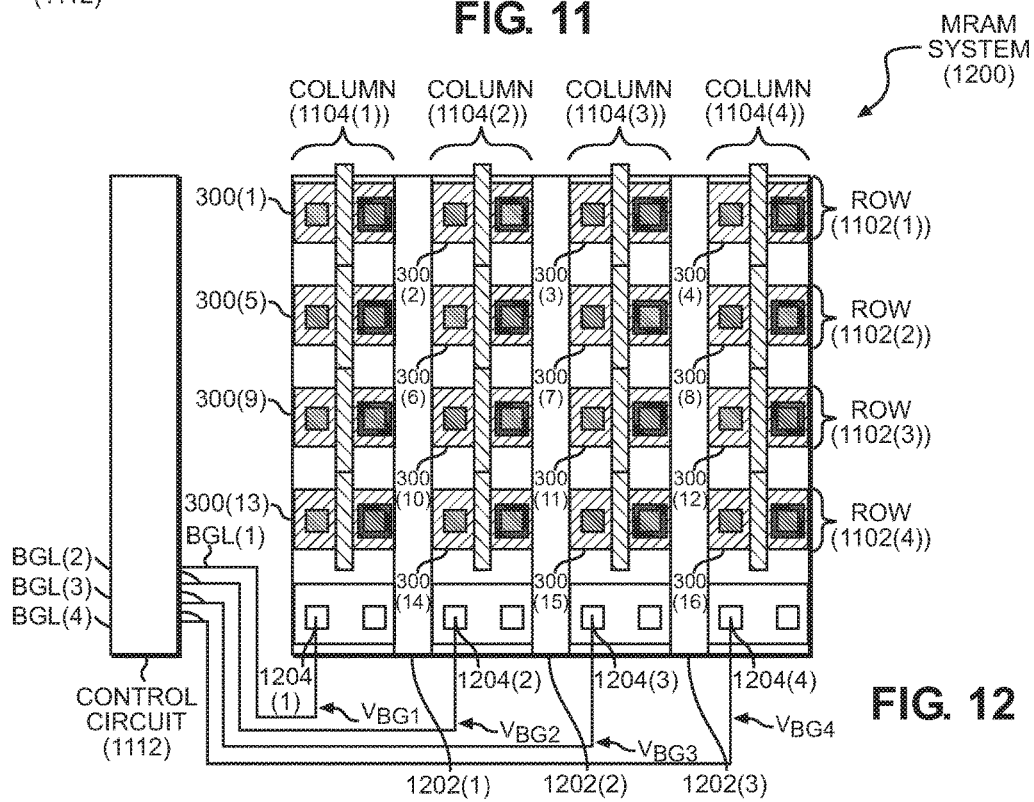
FIG. 12 is a top-view diagram of another exemplary MRAM system that includes MRAM bit cells configured for back gate biasing to reduce or avoid write operation failures caused by source degeneration and that are electrically isolated by an STI region.

FIG. 12 is a top-view of another exemplary MRAM system 1200 that includes MRAM bit cells 300(1)-300(16) configured for back gate biasing to reduce or avoid write operation failures caused by source degeneration. The MRAM system 1200 includes common elements with the MRAM system 1100 of FIG. 11, which are referred to with common element numbers in FIG. 11 and FIG. 12, and thus will not be re-described herein. The MRAM bit cells 300(1)-300(16) of each column 1104(1)-1104(4) in FIG. 12 are electrically isolated by an STI trench 1202(1)-1202(3). In this manner, each back gate line (BGL(1))-(BGL(4)) is electrically coupled to each MRAM bit cell 300(1)-300(16)

of each corresponding column 1104(1)-1104(4) using a corresponding tap 1204(1)-1204(4), such that back gate biasing can be accomplished on a column 1104(1)-1104(4) basis rather than on a row 1102(1)-1102(4) basis as in FIG. 11.

Back gate biasing MRAM bit cells to reduce or avoid write operation failures caused by source degeneration according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
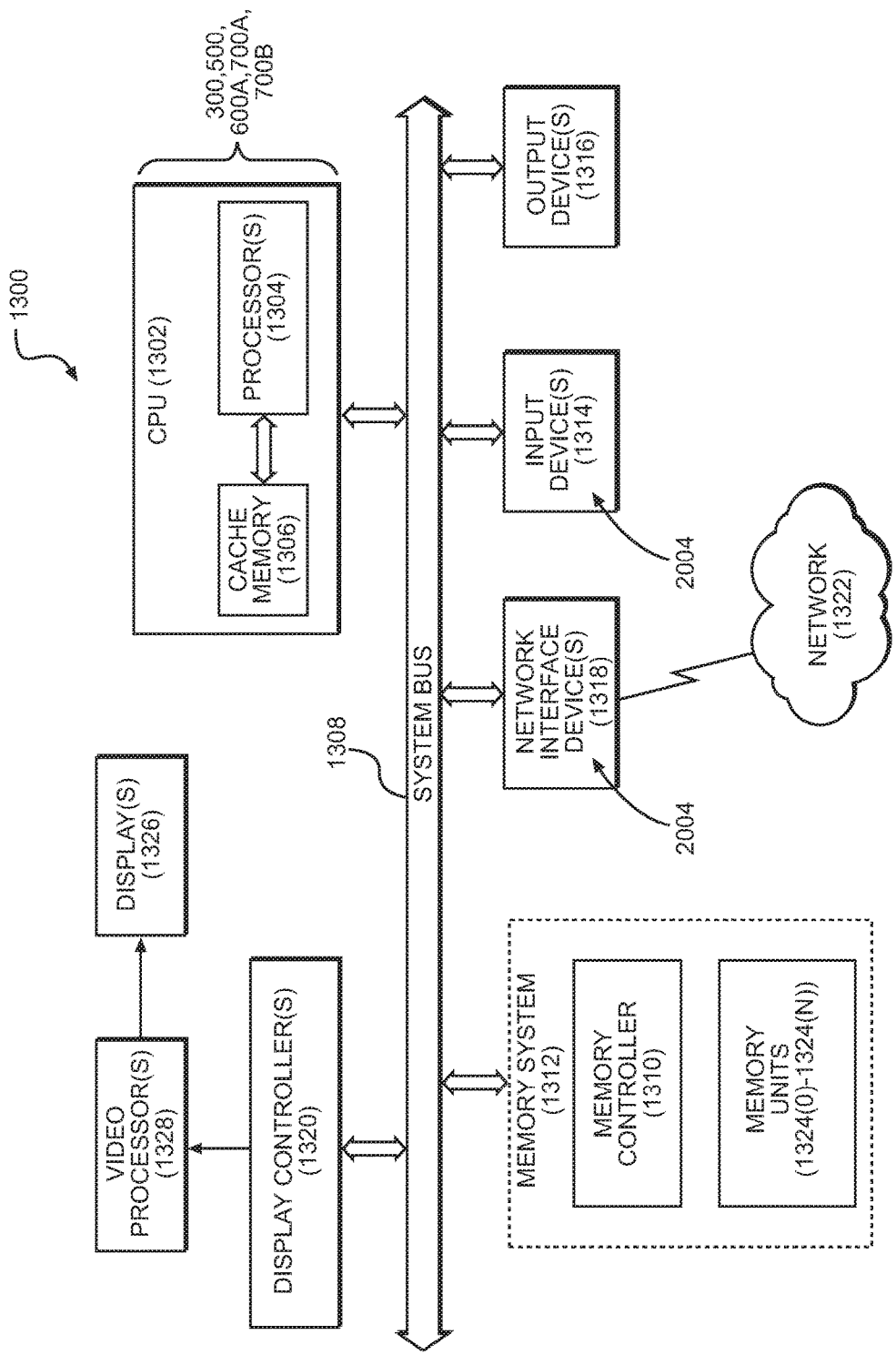
FIG. 13 is a block diagram of an exemplary processor-based system that can include elements employing the MRAM bit cell configured for back gate biasing to reduce or avoid write operation failures caused by source degeneration, including but not limited to the MRAM bit cells in FIGS. 3 and 5-7B.

In this regard, FIG. 13 illustrates an example of a processor-based system 1300 that can include elements employing the MRAM bit cells 300, 500, 600A, 600B, 700A, and 700B configured for back gate biasing to reduce or avoid write operation failures caused by source degeneration of FIGS. 3 and 5-7B, respectively. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320, as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any device configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0)-1324(N).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Figure 14:
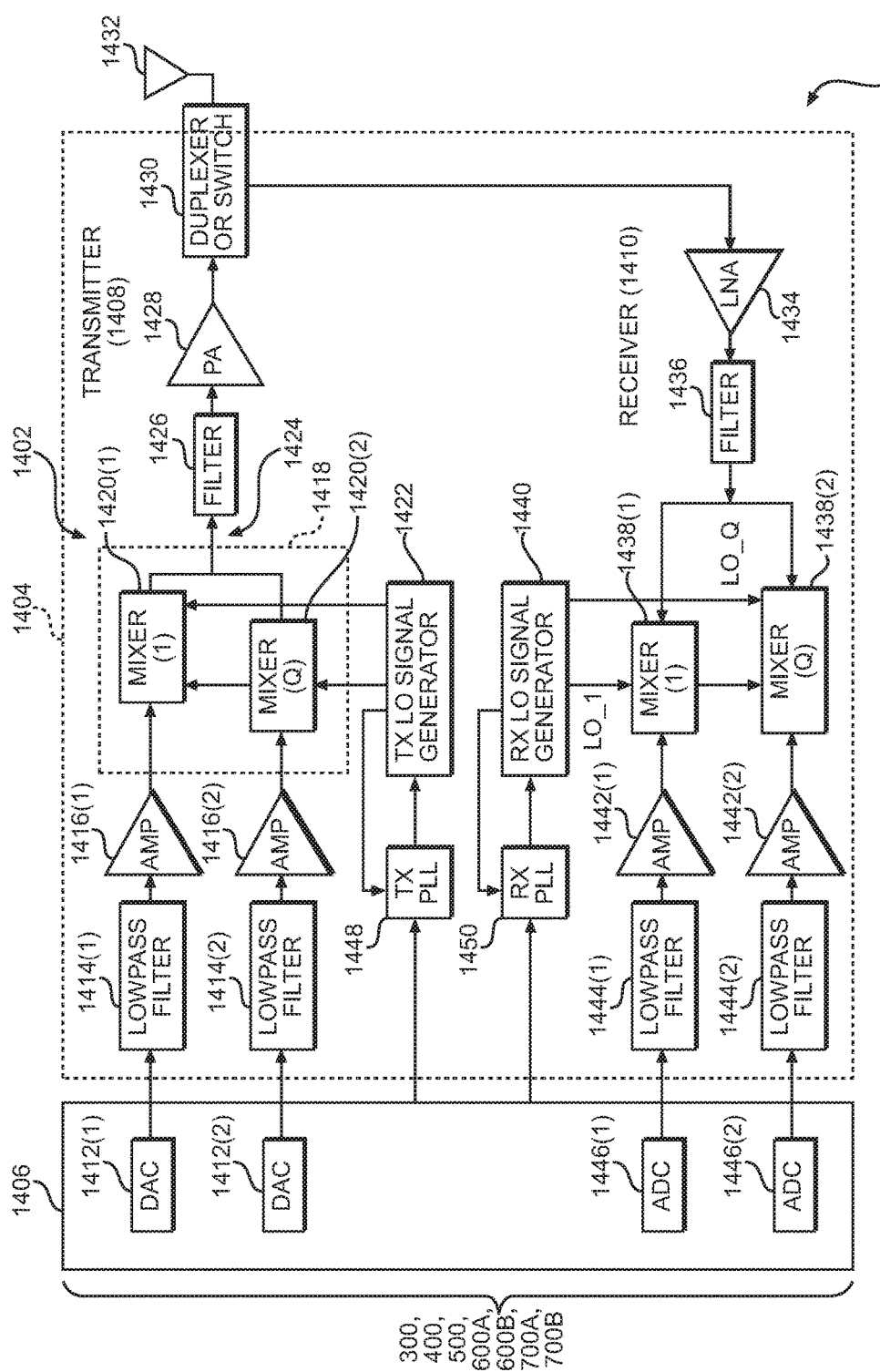
FIG. 14 is a block diagram of an exemplary wireless communications device that includes radio frequency (RF) components formed in an integrated circuit (IC), wherein the RF components can include elements employing the MRAM bit cell configured for back gate biasing to reduce or avoid write operation failures caused including but not limited to the MRAM bit cells in FIGS. 3 and 5-7B.

FIG. 14 illustrates an exemplary wireless communications device 1400 that includes radio frequency (RF) components formed in an integrated circuit (IC) 1402, wherein the RF components can include elements employing the MRAM bit cells 300, 500, 600A, 600B, 700A, and 700B configured for back gate biasing to reduce or avoid write operation failures caused by source degeneration of FIGS. 3 and 5-7B, respectively. In this regard, the wireless communications device 1400 may be provided in the IC 1402. The wireless communications device 1400 may include or be provided in any of the above referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communication. In general, the wireless communications device 1400 may include any number of transmitters and/or receivers for any number of communication systems and frequency bands. All or a portion of the transceiver 1404 may be implemented on one or more analog ICs, RF ICs (RFICs), mixed-signal ICs, etc.

A transmitter 1408 or a receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog-converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMP) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Downconversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by amplifiers (AMP) 1442(1), 1442(2) and further filtered by lowpass filters 1444(1), 1444(2) to obtain I and Q analog input signals, which are provided to the data processor 1406. In this example, the data processor 1406 includes analog-to-digital-converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magneto-resistive random access memory (MRAM) bit cell, comprising:
   a magnetic tunnel junction (MTJ) device, comprising:
   a first ferromagnetic layer;
   a second ferromagnetic layer electrically coupled to a bit line; and
   a tunnel barrier disposed between the first ferromagnetic layer and the second ferromagnetic layer; and
   an access transistor, comprising:
   a substrate layer;
   a well region formed over the substrate layer;
   a buried oxide (BOX) region formed over the well region;
   a channel region formed over the BOX region;

a first region formed over the BOX region on a first side of the channel region, the first region electrically coupled to the first ferromagnetic layer of the MTJ device;

a second region formed over the BOX region on a second side of the channel region, the second region electrically coupled to a source line;

a gate region formed over the channel region between the first region and the second region, the gate region electrically coupled to a word line; and a back gate electrode formed over the well region, wherein the back gate electrode is electrically coupled to the well region and a back gate line configured to apply a back gate bias voltage controlled to be greater than or equal to a back gate voltage associated with the access transistor having a nominal threshold voltage corresponding to operation without source degeneration plus a voltage corresponding to a source region of the access transistor.

2. The MRAM bit cell of claim 1, wherein the access transistor is formed using a fully depleted (FD) silicon-on-insulator (SOI) (FDSOI) process technology.

3. The MRAM bit cell of claim 1, wherein the well region comprises an N-type doped material well (N-well) region.

4. The MRAM bit cell of claim 1, wherein the access transistor further comprises a second well region formed between the substrate layer and the well region.

5. The MRAM bit cell of claim 4, wherein:
the well region comprises a P-type doped material well (P-well) region; and
the second well region comprises a deep N-type doped material well (Deep N-well) region.

6. The MRAM bit cell of claim 1, wherein the access transistor further comprises a shallow trench isolation (STI) region formed in the well region between the back gate electrode and the BOX region.

7. The MRAM bit cell of claim 6, further comprising a STI region formed in the substrate layer adjacent to the first region, the BOX region, and the well region, wherein a bottom surface of the STI region of the MRAM bit cell is above a bottom surface of the well region.

8. The MRAM bit cell of claim 6, further comprising a second STI region formed in the well region of the access transistor adjacent to the first region and the BOX region, wherein a bottom surface of the second STI region of the MRAM bit cell is below a bottom surface of the well region.

9. The MRAM bit cell of claim 1, wherein:
the first ferromagnetic layer of the MTJ device is formed below the second ferromagnetic layer of the MTJ device;
the first ferromagnetic layer comprises a pinned layer; and
the second ferromagnetic layer comprises a free layer.

10. The MRAM bit cell of claim 1, wherein:
the first ferromagnetic layer of the MTJ device is formed above the second ferromagnetic layer of the MTJ device;
the first ferromagnetic layer comprises a pinned layer; and
the second ferromagnetic layer comprises a free layer.

11. The MRAM bit cell of claim 1, wherein:
the first ferromagnetic layer of the MTJ device is formed above the second ferromagnetic layer of the MTJ device;
the first ferromagnetic layer comprises a free layer; and
the second ferromagnetic layer comprises a pinned layer.

12. The MRAM bit cell of claim 1, wherein:
the first ferromagnetic layer of the MTJ device is formed below the second ferromagnetic layer of the MTJ device;
the first ferromagnetic layer comprises a free layer; and
the second ferromagnetic layer comprises a pinned layer.

13. The MRAM bit cell of claim 7, wherein:
the first region comprises a source region; and
the second region comprises a drain region.

14. The MRAM bit cell of claim 1 integrated into an integrated circuit (IC).

15. The MRAM bit cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A magneto-resistive random access memory (MRAM) bit cell, comprising:
a magnetic tunnel junction (MTJ) device, comprising:
  a first ferromagnetic layer;
  a second ferromagnetic layer electrically coupled to a bit line; and
  a tunnel barrier disposed between the first ferromagnetic layer and the second ferromagnetic layer; and
an access transistor, comprising:
  a first region electrically coupled to the first ferromagnetic layer of the MTJ device;
  a second region electrically coupled to a source line;
  a gate region electrically coupled to a word line; and
  a back gate electrode electrically coupled to a back gate line configured to apply a back gate bias voltage controlled to be greater than or equal to a back gate voltage associated with the access transistor having a nominal threshold voltage corresponding to operation without source degeneration plus a voltage corresponding to a source region of the access transistor.

17. The MRAM bit cell of claim 16, wherein the access transistor is formed using a fully depleted (FD) silicon-on-insulator (SOI) (FDSOI) process technology.

18. The MRAM bit cell of claim 16, wherein:
the first ferromagnetic layer of the MTJ device comprises a pinned layer; and
the second ferromagnetic layer of the MTJ device comprises a free layer.

19. The MRAM bit cell of claim 16, wherein:
the first ferromagnetic layer of the MTJ device comprises a free layer; and
the second ferromagnetic layer of the MTJ device comprises a pinned layer.

20. A method for writing to a magneto-resistive random access memory (MRAM) bit cell, comprising:
applying a source line voltage to a source line electrically coupled to a second region of an access transistor, wherein a first region of the access transistor is electrically coupled to a first ferromagnetic layer of a magnetic tunnel junction (MTJ) device;

applying a bit line voltage to a bit line electrically coupled to a second ferromagnetic layer of the MTJ device;

applying a back gate bias voltage that is greater than or equal to a back gate voltage associated with the access transistor having a nominal threshold voltage corresponding to operation without source degeneration plus a voltage corresponding to a source region of the access transistor to a back gate line electrically coupled to a back gate electrode of the access transistor; and applying a word line voltage to a word line electrically coupled to a gate region of the access transistor.

21. A magneto-resistive random access memory (MRAM) system, comprising:
a plurality of MRAM bit cells, wherein each MRAM bit cell comprises:
   a magnetic tunnel junction (MTJ) device, comprising:
      a first ferromagnetic layer;
      a second ferromagnetic layer electrically coupled to a corresponding bit line; and
      a tunnel barrier disposed between the first ferromagnetic layer and the second ferromagnetic layer; and
   an access transistor, comprising:
      a substrate layer;
      a well region formed over the substrate layer;
      a buried oxide (BOX) region formed over the well region;
      a channel region formed over the BOX region;
      a first region formed over the BOX region on a first side of the channel region, the first region electrically coupled to the first ferromagnetic layer of the MTJ device;
      a second region formed over the BOX region on a second side of the channel region, the second region electrically coupled to a corresponding source line;
      a gate region formed over the channel region between the first region and the second region, the gate region electrically coupled to a corresponding word line; and
      a back gate electrode formed over the well region, wherein the back gate electrode is electrically coupled to the well region and a back gate line configured to apply a back gate bias voltage controlled to be greater than or equal to a back gate voltage associated with the access transistor having a nominal threshold voltage corresponding to operation without source degeneration plus a voltage corresponding to a source region of the access transistor; and
one or more shallow trench isolation (STI) regions, wherein each STI region is formed between and electrically isolates at least two (2) MRAM bit cells of the plurality of MRAM bit cells.

22. The MRAM system of claim 21, wherein each access transistor further comprises an STI region formed in the well region between the back gate electrode and the BOX region.

23. The MRAM system of claim 21, wherein each STI region of the one or more STI regions of the MRAM system is formed in the substrate layer between two MRAM bit cells, wherein a bottom surface of each STI region is above a bottom surface of the well region of the two MRAM bit cells.

24. The MRAM system of claim 21, wherein each STI region of the one or more STI regions of the MRAM system is formed in the substrate layer between two MRAM bit cells, wherein a bottom surface of each STI region is below a bottom surface of the well region of the two MRAM bit cells.

25. The MRAM system of claim 21, further comprising a control circuit configured to apply the back gate bias voltage controlled to be greater than or equal to the back gate voltage associated with the access transistor having the nominal threshold voltage corresponding to operation without source degeneration plus the voltage corresponding to the source region of the corresponding access transistor to the back gate line in response to a high resistance write operation.

26. The MRAM system of claim 25, wherein:
the first ferromagnetic layer of the MTJ device of each MRAM bit cell of the plurality of MRAM bit cells is formed below the second ferromagnetic layer of the MTJ device;
the first ferromagnetic layer of the MTJ device of each MRAM bit cell of the plurality of MRAM bit cells comprises a pinned layer; and
the second ferromagnetic layer of the MTJ device of each MRAM bit cell of the plurality of MRAM bit cells comprises a free layer;
wherein the high resistance write operation corresponds to a write operation that changes a magnetic orientation of the free layer from parallel to anti-parallel.

27. The MRAM system of claim 25, wherein:
the first ferromagnetic layer of the MTJ device of each MRAM bit cell of the plurality of MRAM bit cells is formed above the second ferromagnetic layer of the MTJ device;
the first ferromagnetic layer of the MTJ device of each MRAM bit cell of the plurality of MRAM bit cells comprises a pinned layer; and
the second ferromagnetic layer of the MTJ device of each MRAM bit cell of the plurality of MRAM bit cells comprises a free layer;
wherein the high resistance write operation corresponds to a write operation that changes a magnetic orientation of the free layer from anti-parallel to parallel.

* * * * *